United States Patent [19]
Ishikawa et al.

[11] Patent Number: 6,066,598
[45] Date of Patent: *May 23, 2000

[54] SUPERCONDUCTING MULTILAYER ELECTRODE AND METHOD OF PRODUCING SAME

[75] Inventors: Yohei Ishikawa, Kyoto; Seiji Hidaka, Nagaokakyo; Norihumi Matsui, Kyoto; Tomoyuki Ise, Nagaokakyo, all of Japan

[73] Assignee: Murata Manufacturing Co., Ltd., Japan

[*] Notice: This patent is subject to a terminal disclaimer.

[21] Appl. No.: 08/621,651

[22] Filed: Apr. 30, 1996

[30] Foreign Application Priority Data

Mar. 27, 1995 [JP] Japan ..................... 7-068453

[51] Int. Cl.[7] .......................................... H01P 3/08
[52] U.S. Cl. ..................... 505/210; 333/99 S; 333/238
[58] Field of Search .................. 333/99 S, 238, 333/246, 219; 505/210, 700, 701, 866

[56] References Cited

U.S. PATENT DOCUMENTS

| | | | |
|---|---|---|---|
| 2,769,148 | 10/1956 | Clogston | 333/236 |
| 2,769,150 | 10/1956 | Black et al. | 333/243 |
| 4,918,050 | 4/1990 | Dworsky | 505/701 X |

FOREIGN PATENT DOCUMENTS

| | | | |
|---|---|---|---|
| 954528 | 12/1956 | Germany . | |
| 5-085705 | 4/1993 | Japan | 505/701 |
| 9461566 | 3/1995 | WIPO . | |

OTHER PUBLICATIONS

Blennemann, H. et al; "Novl Microstructuse for Low Distortion Chip to Chip Interconnects"; SPIE, Int'l Conf on advances in Interconnetrons and packaging; vol. 1389, 1990; pp. 215–235.

*Primary Examiner*—Benny T. Lee
*Attorney, Agent, or Firm*—Ostrolenk, Faber, Gerb & Soffen, LLP

[57] ABSTRACT

A superconductor layer is formed on one side of a dielectric substrate, and with this superconductor layer as a conductor layer of the bottommost layer, superconductor layers and dielectric layers are alternately laminated with each other. Thus, a superconducting multilayer electrode is provided which is laminated with at least one TEM mode transmission line which is constituted of a pair of superconductor layers with a dielectric layer sandwiched in between, and the superconductor layer and the dielectric layer have film thicknesses which are set so that the maximum value of the current density flowing through each superconductor layer becomes the same. The resistance to electric power of the superconducting multilayer electrode is proportional to the number of laminated layers.

9 Claims, 17 Drawing Sheets

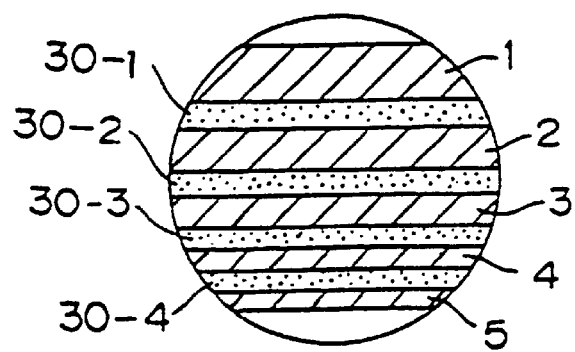
FIG. 3(a)
FIG. 3
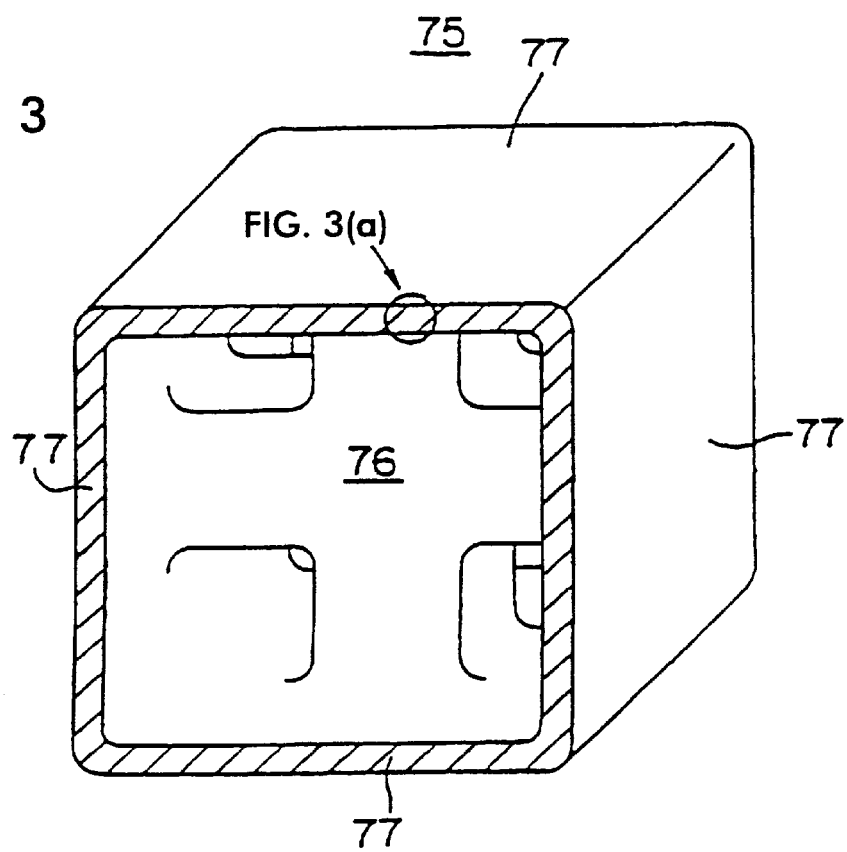

RATE OF CHANGE OF DIELECTRIC FILM THICKNESS $\lambda 1$

RATE OF CHANGE OF CONDUCTOR FILM THICKNESS $\xi 2$

RATE OF CHANGE OF DIELECTRIC FILM THICKNESS λ2

RATE OF CHANGE OF CONDUCTOR FILM THICKNESS ξ 3

RATE OF CHANGE OF CONDUCTOR FILM THICKNESS $\xi 4$

RATE OF CHANGE OF DIELECTRIC FILM THICKNESS $\lambda 4$

SUPERCONDUCTING MULTILAYER ELECTRODE AND METHOD OF PRODUCING SAME

BACKGROUND OF THE INVENTION

1. Field of the Invention

The present invention relates to a superconducting multilayer electrode for use in the high-frequency bands of microwaves, decimillimetric waves, or millimetric waves, various devices using superconducting multilayer electrodes, such as high-frequency transmission lines, high-frequency resonators, high-frequency filters or high-frequency devices, and a method of producing such electrode, more specifically a method of setting a film thickness of such superconducting multilayer electrode.

2. Description of the Related Art

In the high-frequency bands of microwaves, decimillimetric waves, or millimetric waves, it is preferable that electronic parts, such as cavity resonators or dielectric resonators using each mode of TEM, TE, and TM, be made small and light in weight by using high-dielectric constant materials, as well as that conductor loss be decreased to obtain a high no-load Q. Energy loss of a high-frequency device can be broadly classified into conductor loss due to a skin effect and dielectric loss due to a dielectric material. In recent years, dielectric materials which have a low-loss characteristic, though they have a high-dielectric constant, have been developed and put into practical use. Therefore, the conductor loss is more dominant than the dielectric loss in the no-load Q of the circuit. To solve this problem, Japanese Patent Laid-Open No. 6-310900 disclose a multilayer electrode in which dielectric layers and thin-film conductor layers are alternately laminated.

When superconducting materials are used in electrodes or shielding conductors of electronic parts, such as cavity resonators or dielectric resonators using each mode of TEM, TE, and TM, the superconductor is preferable because the electrical resistance of the superconductor is zero, and its surface resistance is small.

When the superconductor is placed in an electromagnetic field, supercurrent flows on the surface of the superconductor, making it possible to prevent the penetration of the electromagnetic field. However, when the electromagnetic field becomes strong and the supercurrent exceeds the critical current density, the superconductor becomes a normal conductor and is no longer a superconductor. Therefore, it is necessary to use the superconductor at a critical current density or smaller. This critical current density makes the upper limit of the resistance to electric power of electronic parts low to such an extent as being too low from a practical standpoint. Also, this fact causes a technological difficulty of applying superconducting materials to practical devices in the microwave and millimetric wave bands.

SUMMARY OF THE INVENTION

It is an object of the present invention to provide a superconducting multilayer electrode whose resistance to electric power is remarkably improved by effectively increasing the critical current density of an electrode which uses a superconducting material, and to provide electronic parts which use such a superconducting multilayer electrode.

It is another object of the present invention to provide a method of producing such a superconducting multilayer electrode.

According to one aspect of the present invention, there is provided a first superconducting multilayer electrode which is laminated with at least one TEM mode transmission line formed of a pair of superconductor layers with a dielectric layer sandwiched between the superconductor layers by forming a superconductor layer on one side of a dielectric substrate and, with this superconductor layer as the bottommost layer, by alternately laminating a superconductor layer and a dielectric layer, wherein the superconductor layer and the dielectric layer have film thicknesses which are set so that the maximum value of the current density flowing through each superconductor layer becomes the same.

Preferably, the superconductor layers from the bottommost layer to the topmost layer have film thicknesses such that the more upper the layer, the greater the thickness becomes, and the dielectric layers from the bottommost layer to the topmost layer have film thicknesses such that the more upper the layer, the greater the thickness becomes.

Preferably, when the film thickness of the superconductor layer of the k-th layer, normalized by the penetration depth of London, is denoted as $\xi_k$, the film thickness of the dielectric layer of the k-th layer, normalized by the penetration depth of London, is denoted as $x_k$, and the number of superconductor layers is set at n, the superconductor layers and the dielectric layers from the bottommost layer (k=n) to the topmost layer (k=1) have film thicknesses $\xi_k$ and $x_k$ (k<n) respectively shown in the table below in the tenth or above layers:

TABLE 3

| k | $\xi_k$ | $W_k = X_k(\epsilon_m/\epsilon_s - 1)$ |
|---|---|---|
| 1 | ∞ | 1.0000 |
| 2 | 0.8814 | 0.7071 |
| 3 | 0.6585 | 0.5774 |
| 4 | 0.5493 | 0.5000 |
| 5 | 0.4812 | 0.4472 |
| 6 | 0.4335 | 0.4082 |
| 7 | 0.3977 | 0.3780 |
| 8 | 0.3695 | 0.3536 |
| 9 | 0.3466 | 0.3333 |
| 10 | 0.3275 | 0.3162 |

Preferably, the high-frequency transmission line is a microstrip line.

BRIEF DESCRIPTION OF THE DRAWINGS

FIGS. 3 and 3a shows a double mode type dielectric resonator in accordance with a modification;

FIGS. 4 and 4a shows a $TM_{01\sigma}$ mode type two-step pass filter in accordance with the modification;

FIGS. 5, 5(a), 5(b), and 5(c) are perspective views of various electronic parts in accordance with the modification; and FIG. 5(d) is a sectional view thereof;

DESCRIPTION OF THE PREFERRED EMBODIMENTS

Figure 1:
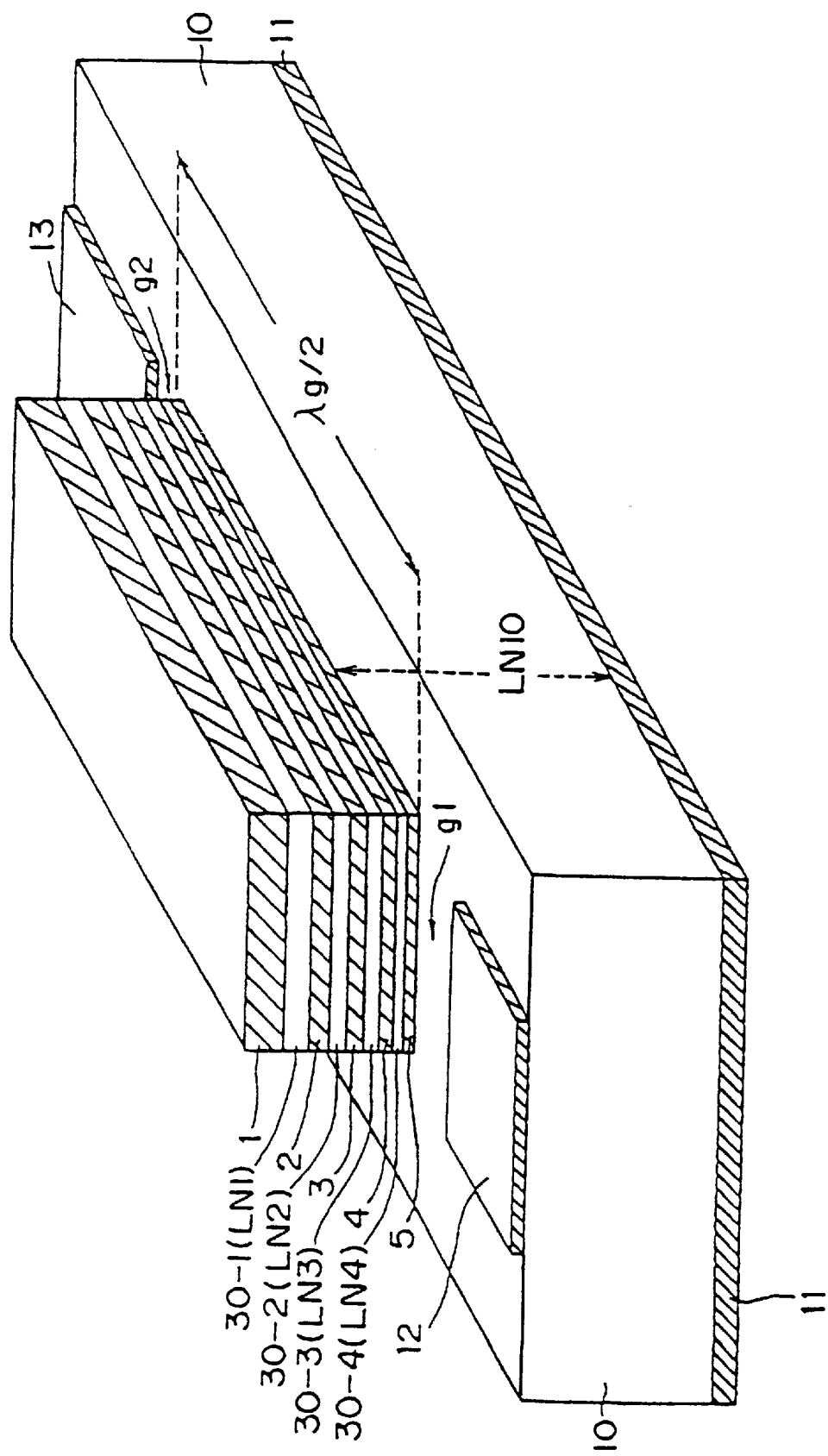
FIG. 1 is a perspective view of a filter employing a ½ wavelength line type resonator which uses a superconducting multilayer line in accordance with a first embodiment of the present invention.

Preferred embodiments of the present invention will be described below with reference to the accompanying drawings. Throughout the figures, the same components are given the same reference numerals.

(1) Summary of a Superconducting Multilayer Electrode and a High-frequency Transmission Line In FIG. 1, the ½ wavelength line type resonator has a feature of employing a transmission line which uses a superconducting multilayer electrode in accordance with the present invention having a construction in which thin-film superconductors 1, 2, 3, 4 and 5 and thin-film dielectrics 30-1, 30-2, 30-3 and 30-4 are alternately laminated. In this transmission line, a superconducting multilayer electrode is formed on the top surface of a dielectric substrate 10 having a ground conductor 11 formed on the bottom surface thereof so as to come into contact with a thin-film superconductor 5 which is the bottommost layer. As a result, the thin-film superconductor 5, the ground conductor 11, and the dielectric substrate 10 sandwiched between the thin-film superconductor 5 and the ground conductor 11 form a TEM mode microstrip line ("main transmission line") LN10. And four TEM mode microstrip lines ("sub-transmission lines") LN1, LN2, LN3 and LN4, in each of which one thin-film dielectric is sandwiched between a pair of thin-film superconductors, are laminated on an elongated line of the main transmission line LN10. In FIG. 1, the reference numerals of the sub-transmission lines are provided in the parentheses with respect to the dielectrics of the sub-transmission lines.

Here, in particular, (a) by making the phase velocities of the TEM waves which propagate through the main transmission line LN10 and the sub-transmission lines LN1 to LN4 substantially coincide with each other by setting the film thicknesses $x_1$, $x_2$, $x_3$ and $x_4$ of the thin-film dielectrics 30-1 to 30-4 and the dielectric constant es as will be described later, and (b) by setting the film thicknesses $\xi 2$, $\xi 3$, $\xi 4$ and $\xi 5$ of the thin-film superconductors 2 to 5 (only $x_1$ and $\xi_1$, are labelled in FIG. 1 for the sake of clarity) so that the more upper the layer, the greater the thickness becomes, as will be described later, the respective electromagnetic fields are coupled to each other between the main transmission line LN10 and the sub-transmission line LN4, between the sub-transmission line LN4 and the sub-transmission line LN3, between the sub-transmission line LN3 and the sub-transmission line LN2, and between the sub-transmission line LN2 and the sub-transmission line LN1, which transmission lines are adjacent to each other. As a result, the high-frequency energy flowing through the main transmission line LN10 is shifted in part to the sub-transmission lines LN4, LN3, LN2, and LN1 so that high-frequency current flows through each of the thin-film superconductors 1 to 5. Thus, the skin effect due to high frequencies can be suppressed greatly.

As shown in FIG. 1, the thin-film superconductor 5 in the form of a strip having a longitudinal length of $\lambda g/2$ ($\lambda g$ is the waveguide length) is formed on the dielectric substrate 10 having the ground conductor 11 formed on the entire surface of the reverse side thereof. Here, the thin-film superconductor 5, the ground conductor 11, and the dielectric substrate 10 sandwiched between the thin-film superconductor 5 and the ground conductor 11 form the main transmission line LN1O formed of a microstrip line. Then, the following are formed on the thin-film superconductor 5 in the following sequence: a thin-film dielectric 30-4, a thin-film superconductor 4, a thin-film dielectric 30-3, a thin-film superconductor 3, a thin-film dielectric 30-2, a thin-film superconductor 2, a thin-film dielectric 30-1, and the thin-film superconductor 1. Here, the sub-transmission lines LN1 to LN4 are formed as described below:

(a) The thin-film dielectric 30-1 is sandwiched between the thin-film superconductor 1 and the thin-film superconductor 2 in pairs, and thus the sub-transmission line LN1 is formed.

(b) The thin-film dielectric 30-2 is sandwiched between the thin-film superconductor 2 and the thin-film superconductor 3 in pairs, and thus the sub-transmission line LN2 is formed.

(c) The thin-film dielectric 30-3 is sandwiched between the thin-film superconductor 3 and the thin-film superconductor 4 in pairs, and thus the sub-transmission line LN3 is formed.

(d) The thin-film dielectric 30-4 is sandwiched between the thin-film superconductor 4 and the thin-film superconductor 5 in pairs, and thus the sub-transmission line LN4 is formed.

Figure 13:
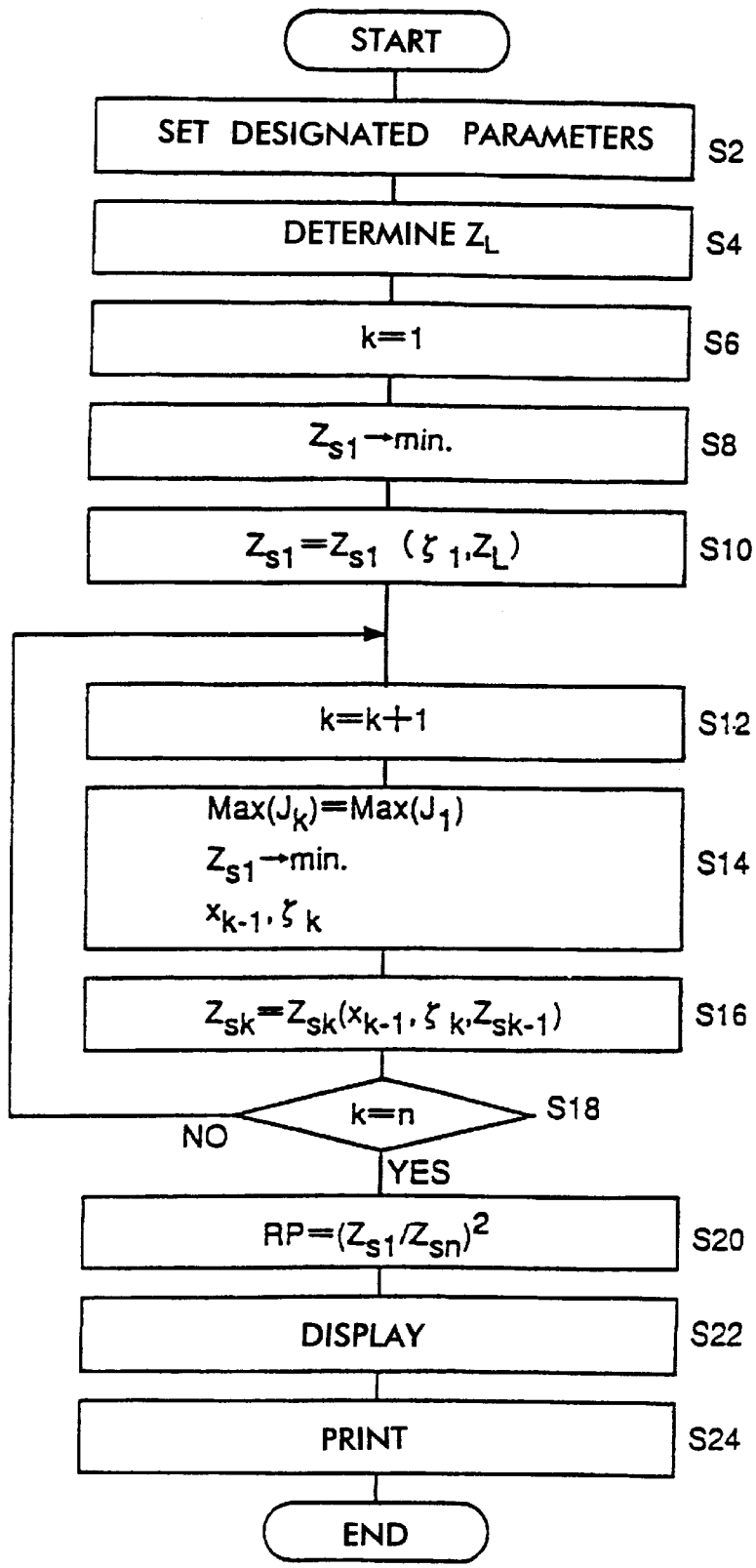
FIG. 13 is a first flowchart of setting an optimum film thickness.
Figure 14:
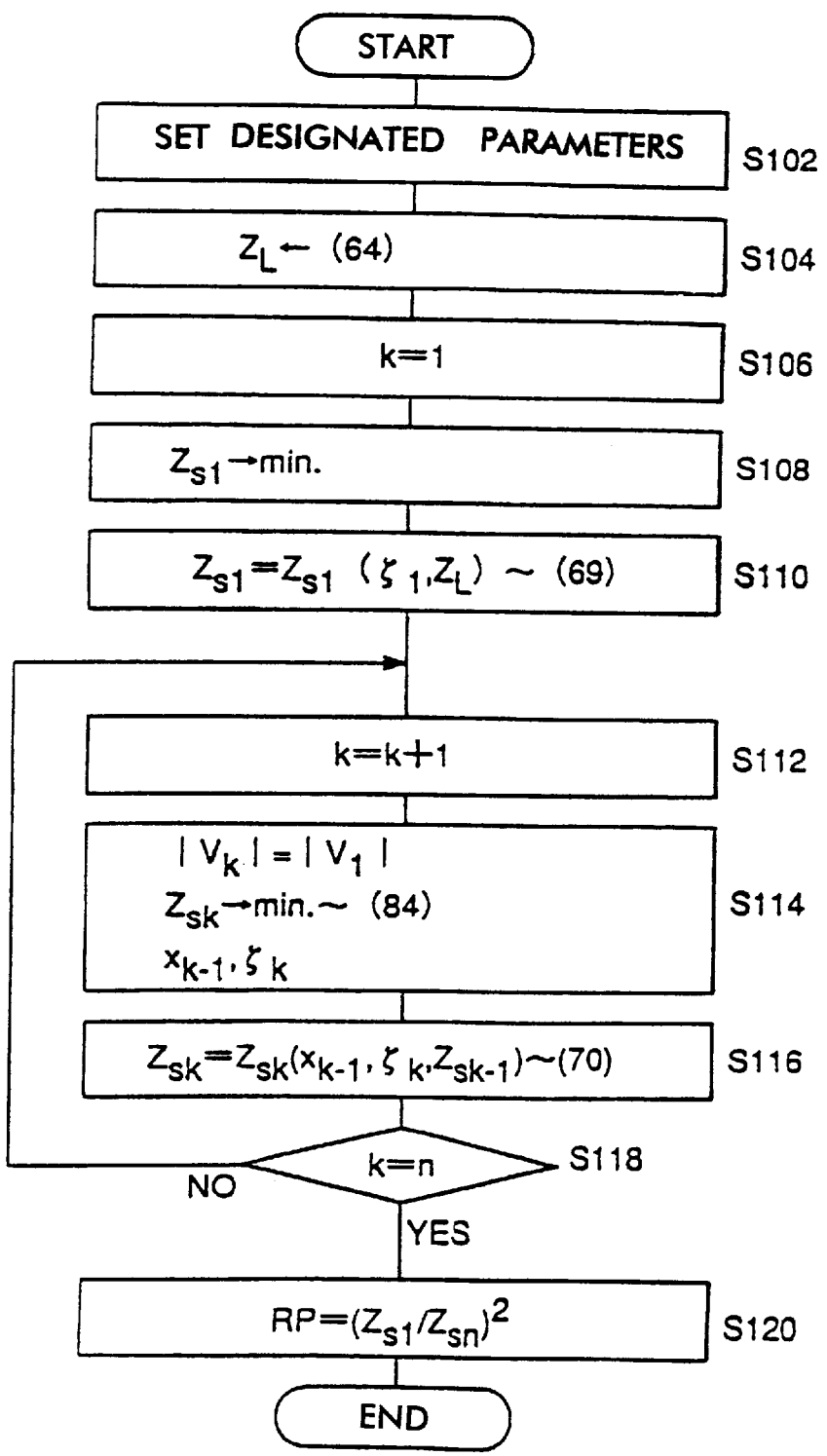
FIG. 14 is a second flowchart of setting the optimum film thickness.
Figure 15:
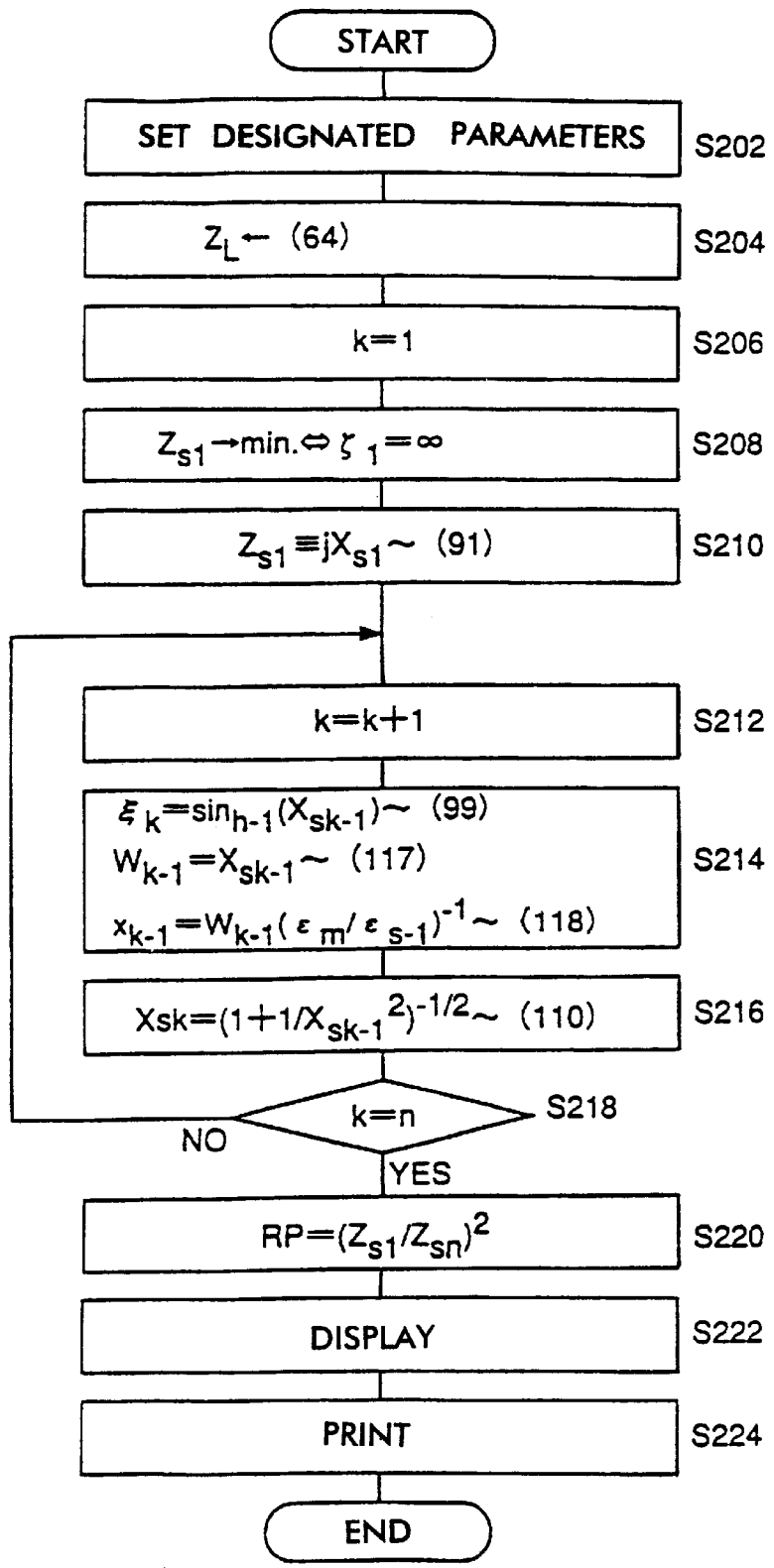
FIG. 15 is a third flowchart of setting the optimum film thickness.

The superconductor film thicknesses $\xi 1$ and $\xi 5$ of the respective thin-film superconductors 1 to 5, and the dielectric film thicknesses $x_1$ to $x_4$ of the thin-film dielectrics 30-1 to 30-4 are set as shown in the flowcharts of FIGS. 13 to 15, as will be described later.

Further, a conductor 12 for an input terminal is formed on the dielectric substrate 10 in such a manner as to be separated by a gap g1 from one end of the thin-film superconductor 5 along the length thereof and in close proximity so as to be electromagnetically coupled to each other, and a conductor 13 for an output terminal is formed on the dielectric substrate 10 in such a manner as to be separated by a gap g2 from one end of the thin-film superconductor 5 along the length thereof and in close proximity so as to be electromagnetically coupled to each other. In the first embodiment, the coupling between the input terminal conductor 12 and one end of the thin-film superconductor 5, and the coupling between the output terminal conductor 13 and the other end of the thin-film superconductor 5 are made by capacitive coupling.

Here, the dielectric substrate 10 is made of sapphire, which is a single crystal of alumina, and the thin-film dielectrics 30-1 to 30-4 are made of, for example, $SiO_2$. For the ground conductor 11 and the thin-film superconductors 1 to 5, the superconductors described below may be used as at least one material, and, preferably, ceramic type oxide superconducting materials described below are used.

(a) Pure metallic superconducting materials, such as Nb or Pb (b) Superconducting alloys, such as Nb—Ti or Nb—Zr system (c) Intermetallic compound type superconducting materials, such as $Nb_3Sn$ or $V_3Si$ (d) Ceramic type oxide superconducting materials, examples of which are listed below (d-1) $La_{2-x}BaCuO_{4-\delta}$ type or $La_{2-x}Sr_xCuO_{4-\delta}$, such as $La_{1.85}Sr_{0.15}CuO_4$ (d-2) $YBa_2Cu_3O_{7-\delta}$ type (quantity of oxygen deficiency $\delta=0$ to 1), such as $YBa_2Cu_3O_7$ (d-3) Bi—Sr—Ca—Cu—O type Such type of materials are obtained by calcining powder in which $Bi_2O_3$, $SrCO_3$, $CaCO_3$, and CuO are mixed at a temperature of 800° to 870° C., and then by sintering it in the atmosphere at a temperature of 850° to 880° C.

(d-4) Tl—Ba—Ca—Cu—O type

Such type of materials having the main $Tl_2CaBa_2Cu_2O_x$ as a main component are obtained by mixing each powder of $Tl_2O_3$, CaO, BaO, and CuO, and molding it, and then sealing it in a quartz tube containing oxygen under the pressure of 1 atm and heating it for three hours at a temperature of 880° C.

Figure 2:
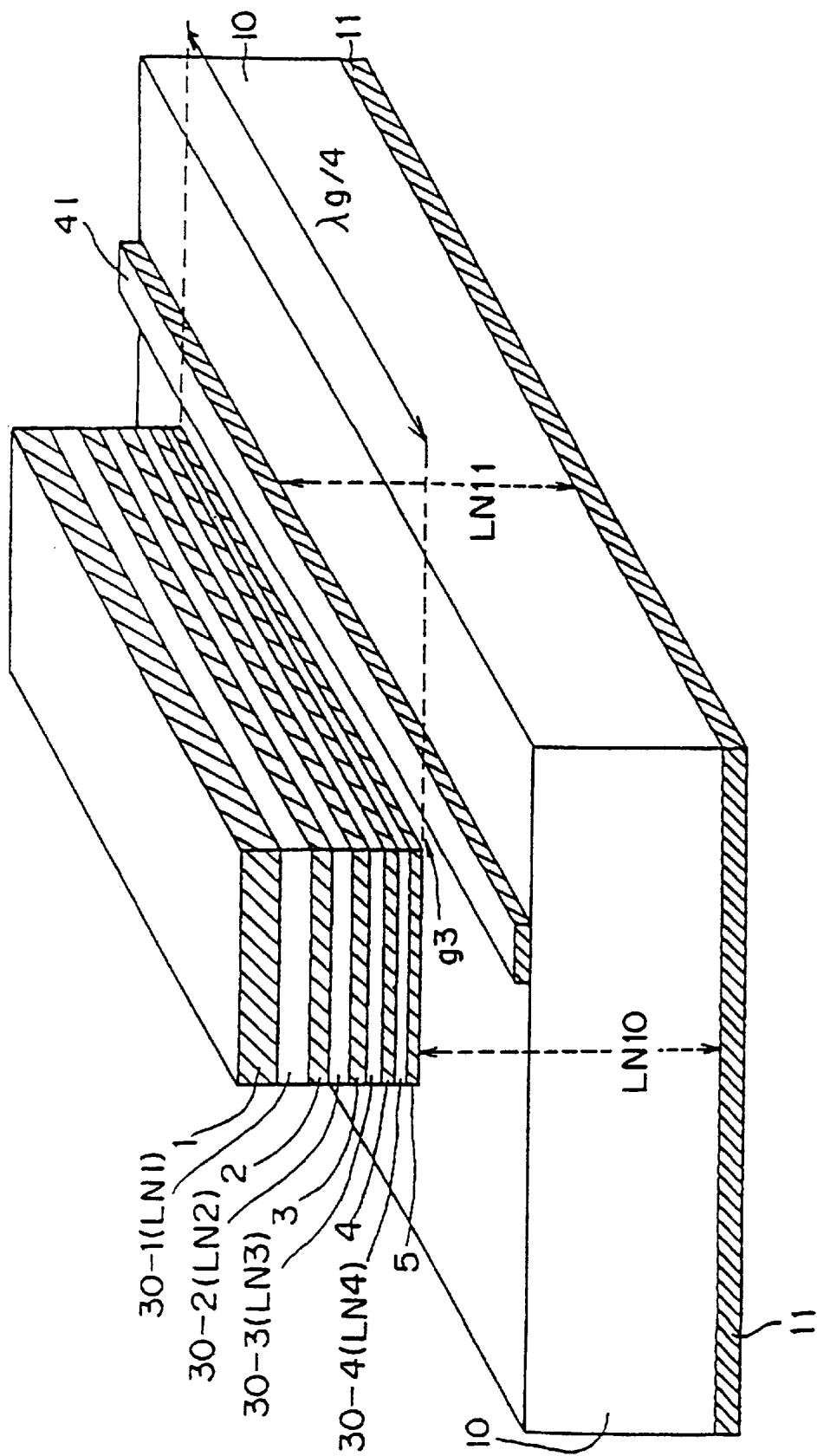
FIG. 2 is a perspective view of a filter employing a ¼ wavelength line type resonator which uses a superconducting multilayer line in accordance with a second embodiment of the present invention.

(d-5) EBCO type (d-6) BPSCCO type (e) Organic superconducting materials, examples of which are listed below (e-1) Tetramethyltetraselenafulvalene (TMTSF) type superconducting materials, such as $(TMTSF)_2ClO_4$ (e-2) Bis(ethylenedithiolo)tetrathiafulvalene (BEDT-TTF) type superconducting materials, such as $\beta(BEDT-TTF)_2I_3$ (e-3) Superconducting materials of dmit type FIG. 2 is a perspective view of a ¼ wavelength line type band-elimination filter employing an electromagnetic coupling type laminated thin-film transmission line which uses a superconducting multilayer electrode of a second embodiment of the present invention. As shown in FIG. 2, a strip conductor 41 is formed on the dielectric substrate 10 having the ground conductor 11 formed on the entire surface of the reverse side thereof, and thus a microstrip line LN11 is formed. The electrode of the first embodiment comprising the laminated thin-film superconductors 1, 2, 3, 4 and 5 and the thin-film dielectrics 30-1, 30-2, 30-3 and 30-4, and having a length of ¼ $\lambda g$ is formed in such a way that the bottommost thin-film superconductor 5 is in close proximity, by a separation of a gap g3, to the strip conductor 41 so as to be electromagnetically coupled to the strip conductor 41 of the microstrip line LN11, and the lengths of the thin-film superconductors 1 to 5 and the thin-film dielectrics 30-1 to 30-4 become parallel to the length of the strip conductor 41. The film thicknesses $\xi_1$ and $\xi_5$ of the respective thin-film superconductors 1 to 5 of the respective ¼ wavelength line type band-elimination filters in accordance with the second embodiment, and the film thicknesses $x_1$ to $x_4$ of the thin-film dielectrics 30-1 to 30-4 are set at the same as those of the first embodiment and, for the sake of clarity, only $x_1$ and $\xi_1$, are labelled in FIG. 2.

In the circuit constructed as described above, a resonator having an extremely small conductor loss can be constructed by an electromagnetic coupling type thin-film laminated transmission line of a ¼ wavelength line. Therefore, by forming the ground conductor 11 which is electromagnetically coupled to the resonator, a ¼ wavelength line type band-elimination filter having an extremely large no-load Q can be constructed.

In the second embodiment, the microstrip line LN11 is used. However, the present invention is not limited to this example, and may be constructed by a transmission line, such as a coplanar line, a slot line, or a triplate type strip line.

The superconducting multilayer electrode of the present invention can be applied to an electrode film part provided on the outer surface of a cavity in a TM-mode single-mode type dielectric resonator in which a core dielectric and a cavity are monolithically molded, as disclosed in, for example, Japanese Patent Laid-Open No. 3-292006. As for the TM mode dielectric resonator, it may be applied to not only the TM-mode single-mode type, but also to a double mode type dielectric resonator disclosed in, for example, Japanese Patent Laid-Open No. 63-313901, and further to a triplet mode type dielectric resonator disclosed in, for example, Japanese Patent Laid-Open No. 61-157101. That is, it is possible to apply the superconducting multilayer electrode of the present invention to the electrode film part of a TM mode dielectric resonator.

FIG. 3 shows an example of a double mode type dielectric resonator 75 in accordance with a modification of the above-described embodiment. Provided in the central portion of the inside of a resonator case 77 in a square, cylindrical shape, whose outer surface of a dielectric is metallized, is a dielectric 76 in a cross shape which is monolithically molded with the case 77, and thus the double mode type dielectric resonator 75 is formed. For the electrode of the resonator case 77, the superconducting multilayer electrode of the present invention is used. As a result, since the surface resistance of the electrode can be decreased greatly, it is possible to decrease the loss of the dielectric resonator and to increase the no-load Q.

Figure 4:
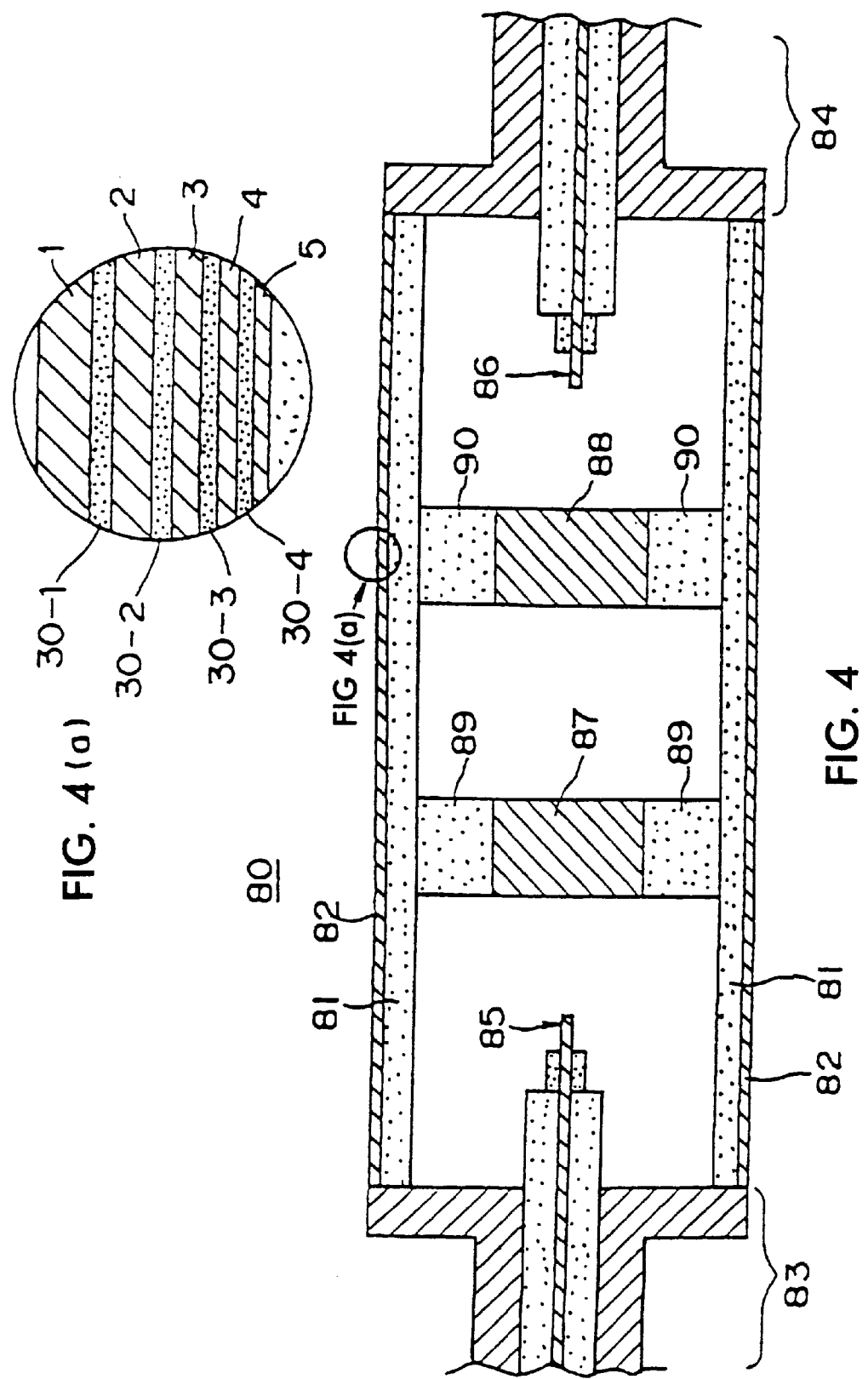

FIG. 4 shows an example of a TM01$\delta$ mode type two-step dielectric band pass filter 80 in accordance with the modification. The band pass filter 80 is constructed as described below. Input/output SMA connectors 83 and 84 are mounted on both ends of a cylindrical dielectric tube 81 having an outer electrode 82. The ground conductors of the SMA connectors 83 and 84 are connected to the outer electrode 82, and mono-pole antennas 85 and 86 which face each other inside the dielectric tube 81 are connected to the center conductors of the SMA connectors 83 and 84, respectively. Inside the dielectric tube 81 between the mono-pole antennas 85 and 86, two dielectric resonators 87 and 88 having a columnar shape are provided via dielectric supporting bases 89 and 90 in a ring shape, respectively, which dielectric resonators are separated by a predetermined gap and internally touch the inner surface of the dielectric tube 81. Also in this band pass filter 80, for the outer electrode 82, the superconducting multilayer electrode of the present invention is used. As a result, the surface resistance of the outer electrode 82 can be decreased greatly, making it possible to decrease the loss of the dielectric filter and to increase the no-load Q.

In addition, in a modification described below, use of the superconducting multilayer electrode of the present invention makes it possible to decrease greatly the surface resistance of the electrode in comparison with the prior art and thus makes it possible to greatly decrease the transmission loss.

Figure 5:
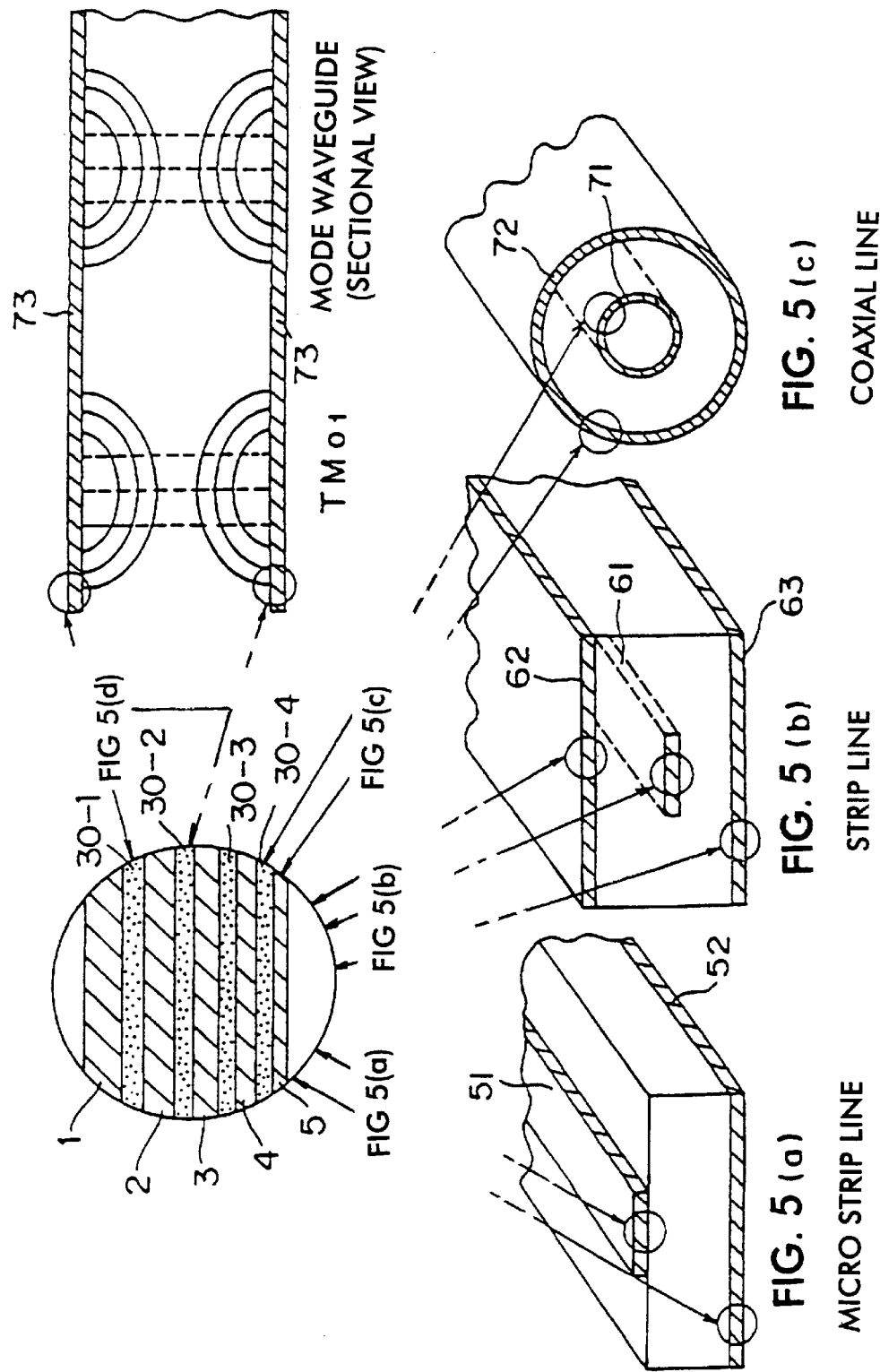

FIG. 5(*a*) is a perspective view of a microstrip line employing the superconducting multilayer electrode of the present invention. For a strip conductor 51 and a ground conductor 52 of the microstrip line, the superconducting multilayer electrode is used. The superconducting multilayer electrode may be used for only the strip conductor 51, or the superconducting multilayer electrode may be used for only the ground conductor 52.

FIG. 5(*b*) is a perspective view of a triplate type strip line employing the superconducting multilayer electrode of the present invention. For a strip conductor 61 and ground conductors 62 and 63 of the microstrip line, the superconducting multilayer electrode is used. The superconducting multilayer electrode may be used for only the strip conductor 61, or the superconducting multilayer electrode may be used for only one of the ground conductors 62 and 63.

FIG. 5(*c*) is a perspective view of a coaxial line employing the superconducting multilayer electrode of the present invention. For a center conductor 71 and a ground conductor 72 of the coaxial line, the superconducting multilayer electrode is used. The superconducting multilayer electrode may be used for only the center conductor 71, or the superconducting multilayer electrode may be used for only the ground conductor 72.

FIG. 5(*d*) is a longitudinal sectional view of a TM01 mode circular waveguide employing a superconducting multilayer electrode 73 of the present invention. For the outer electrode of the circular waveguide, the superconducting multilayer electrode is used. Though not shown, the superconducting multilayer electrode may be used in the outer electrode of a suspended line, a coplanar line, a slot line, a rectangular waveguide, a ridge waveguide, a circular waveguide, a dielectric line, a G line, an image line, an H line, and the like.

Further, it is possible to use the superconducting multilayer electrode of the present invention in the electrode of various high-frequency devices for performing respective designated high-frequency operations, such as inductors or capacitors of an isolator, an antenna, a chip coil, and the like.

In the above-described embodiments, the thin-film dielectrics 30-1 to 30-4 of solids are used. However, the present invention is not limited to this example, and a gas, such as air, or a liquid may be used in place of the thin-film dielectrics 30-1 to 30-4.

In the above-described embodiments, the ground conductor 11 is made of a conductor having electrical conductivity, such as Cu, Ag, or Au.

The superconducting multilayer electrode may be formed of a plurality of different superconducting materials or a plurality of different dielectric materials. For example, another thin dielectric layer or metallic layer may be interposed between the superconductor layer and the dielectric layer as a buffer layer for the purpose of chemical and physical stabilization.

(2) Analysis of the High-frequency Electromagnetic Field of the Inside of a Superconductor by Using a Two-fluid Model The two-fluid model is a model in which it is assumed that two types of electrons are present: superconducting and non-superconducting.

In order to design high-frequency parts by using superconducting materials, it is necessary to express the characteristics of a superconductor by simple medium constants. First, a complex electrical conductivity which is a medium constant which relates between the electric current and the electric field inside a superconductor is derived by a two-fluid model [e.g., see "Microwave Electrical Conduction of Oxide Superconductor", Mineo Kobayashi, Solid Physics, Vol.24, 12, pp.31–39 (1989)] known as a model for explaining the high-frequency characteristics of the superconductor. Next, the electromagnetic field of plane waves inside the superconductor is analyzed by using the complex electrical conductivity, and the fact is shown that the high-frequency characteristics of the superconductor can be handled in the same manner as for the normal conductor by using the complex electrical conductivity.

(2-2) The Two-fluid Model and the Complex Electrical Conductivity

The electrical conduction of a superconductor in a high frequency band can be explained by a two-fluid model electrons having no resistance in the superconductor and normal-conducting electrons having resistance. When the densities of the superconducting electrons and normal-conducting electrons are denoted as $n_s$ and $n_n$, respectively, the density of all the electrons is expressed by the sum of the densities:

$$n = n_s + n_n \qquad (1)$$

The temperature dependences of $n_s$ and $n_n$ are expressed by the following equations, and n does not depend on the temperature T, where $T_c$ is the superconducting transition temperature:

$$n_s/n = 1 - (T/T_c)^4, \quad n_n/n = (T/T_c)^4 \qquad (2)$$

The electric current $J_s$ caused by the superconducting electrons and the electric current $J_n$ caused by the normal-conducting electrons are expressed as the following equations, respectively:

$$J_s = e n_s v_s \qquad (3)$$

$$J_n = e n_n v_n \qquad (4)$$

where e ($=-1.60 \times 10^{-19}$ C) is the electric charge of the electrons, and $v_s$ and $v_n$ are the velocities of the superconducting electrons and the normal-conducting electrons, respectively. The Newton's equations of motion for these electrons are as follows:

$$m_e dv_s/dt = eE \qquad (5)$$

$$m_e dv_n/dt + m_e v_n/\tau = eE \qquad (6)$$

where $m_e$ ($=9.11 \times 10^{-31}$ kg) is the mass of the electrons, $\tau$ is the momentum relaxation time of the electrons, and E is the electric field. By assuming that the time dependence $\tau$ is concerned with a single frequency $\omega$, the time factor is set as $\exp(j\omega t)$. By solving equations (3) to (6), all the current J can be expressed as follows:

$$J = J_s + J_n = \dot\sigma E \qquad (7)$$

where $\dot{\sigma}$ is the complex electrical conductivity and is given by the following equation:

$$\dot{\sigma} = \sigma r - j\sigma i \tag{8}$$

$$\dot{\sigma}_r = n_n e^2 \tau / \{m_e(\omega^2 \tau^2 + 1)\} \tag{9}$$

$$\dot{\sigma}_i = n_s e^2 / (m_e \omega) + n_n e^2 \tau^2 \omega / \{m_e(\omega^2 \tau^2 + 1)\} \tag{10}$$

Use of the complex electrical conductivity instead of the electrical conductivity s of the normal conductor in this way makes it possible to relate between the current and the electric field inside the superconductor.

However, in this two-fluid model, it is assumed that $n_s$ does not depend on the magnetic field. However, strictly speaking, it is known that $n_s$ has magnetic-field dependence. To handle by assuming that $n_s$ does not depend on the magnetic field, it is necessary to impose a limitation such that the magnetic field is sufficiently smaller than the critical magnetic field. In the case of a pure metal superconductor, the coherence length $\xi$ is longer than the penetration depth $\lambda L$ of London. Therefore, in equation (7), J is not determined by E at that point, and non-locality must be taken into consideration. As compared with the pure metal superconductor, in the oxide superconductor, $\lambda L >> \xi$, and this limit is called the London limit. This case will be considered below.

(2-3) Surface Impedance and Propagation Constant

In the case of handling as a one-dimensional problem of plane waves which propagate in the z direction, by substitution of equation (7) in the Maxwell equation, the following equation can be obtained:

$$\partial E_x / \partial z = -j\omega \mu_o H_y \tag{11}$$

$$\partial H_y / \partial z = (\dot{\sigma} + j\omega \in_0) E_x \tag{12}$$

where $E_x$ is the x component of the electric field, $\mu_o$ is the permitivity in a vacuum and Hy is the y component of the magnetic field.

By making a simultaneous equation from these equations, the following Helmholtz equations can be obtained:

$$\partial E^2_x / \partial^2 z + j\omega \mu_0 (\dot{\sigma} + j\omega \in_0) E_x = 0 \tag{13}$$

$$\partial H^2_y / \partial^2 z + j\omega \mu_0 (\dot{\sigma} + j\omega \in_0) H_y = 0 \tag{14}$$

The solutions for these equations are as follows:

$$E_x = E_{xo} \exp(-\gamma z) \tag{15}$$

where $E_{xo}$ is the amplitude of $E_x$ $$H_y = H_{yo} \exp(-\gamma z) \tag{16}$$

where $H_{yo}$ is the amplitude of $H_y$ $$\gamma = \sqrt{j\omega \mu_0 (\dot{\sigma} + j\omega \in_0)} \tag{17}$$

where $\gamma$ is the propagation constant. If $\gamma = \alpha + j\beta$ is set, use of $\sigma_r$ and $\sigma_i$ gives the following:

$$\alpha = \sqrt{(\omega \mu_0)/2 \left( \sqrt{(\sigma_r^2 + \sigma_i^2)} + \sigma_i \right)} \tag{18}$$

$$\beta = \sqrt{(\omega \mu_0)/2 \left( \sqrt{(\sigma_r^2 + \sigma_i^2)} - \sigma_i \right)} \tag{19}$$

where the approximation of $\omega \in << 1$ is used. The surface impedance Zs can be determined as follows:

$$Z_s = E_x / H_y = j\omega \mu_0 / \gamma = \sqrt{j\omega \mu_0 / (\dot{\sigma} + j\omega \epsilon)} \tag{20}$$

When $Z_s = R_s + jX_s$ is set, $R_s$ and $X_s$ can be expressed as follows by using $\sigma_r$ and $\sigma_i$:

$$R_s = \sqrt{(\omega \mu_0 / 2)\left\{\sqrt{(\sigma_r^2 + \sigma_i^2)} - \sigma_i\right\} / (\sigma_r^2 + \sigma_i^2)} \tag{21}$$

$$X_s = \sqrt{(\omega \mu_0 / 2)\left\{\sqrt{(\sigma_r^2 + \sigma_i^2)} + \sigma_i\right\} / (\sigma_r^2 + \sigma_i^2)} \tag{22}$$

Since the quantities which are actually measured are $R_s$ and $X_s$, by solving these relations reversely, $\sigma_r$ and $\sigma_i$ can be expressed as the following equations:

$$\sigma_r + 2\omega \mu_0 R_2 X_s / (R_s^2 + X_s^2)^2 \tag{23}$$

$$\sigma_i + \omega \mu_0 (X_s^2 - R_s^2 / (R_s^2 + X_s^2)^2 \tag{24}$$

(2-4) frequency dependence of $Z_s$, and $\gamma$

Since $\omega^2 \tau^2 << 1$ in the microwave band, equations (9) and (10) can be approximated into the following equations:

$$\sigma_r = n_n e^2 \tau / m_e \tag{25}$$

$$\sigma_i = n_s e^2 / m_e \omega \tag{26}$$

Further, by using the fact that $(\sigma_r / \sigma_i)^2 << 1$ when $T << T_c$ (T: temperature, and $T_c$: the transition temperature), the following equations can be obtained on the basis of equations (21) and (22), respectively:

$$R_s = \sqrt{\omega \mu_0 \sigma_r^2 / (4\sigma_i^3)} = \tau \omega^2 / 2e \sqrt{m_e \mu_0 n_n^2 / n_s^3} \tag{27}$$

$$X_s = \sqrt{\omega \mu_0 / \sigma_i} = \omega / e \sqrt{m_e \mu_0 n / n_s} \tag{28}$$

It can be seen from the above equations that $R_s$ is proportional to $\omega^2$, and $X_s$ is proportional to $\omega$. In a similar manner, the following equations can be obtained on the basis of equations (18) and (19), respectively:

$$\alpha = \sqrt{\omega \mu_0 \sigma_i} = \sqrt{\mu_0 n_s e^2 / m_e} = 1/\lambda_L \tag{29}$$

$$\beta = \sqrt{(\omega \mu_0 / 4)(\sigma_r^2 / \sigma_i)} = (\omega \tau e / 2)\sqrt{(\mu_0 / m_e)(n_n^2 / n_s)} \tag{30}$$

where $\gamma_L$ is the penetration depth of London. It can be seen from the above that the penetration depth of the electromagnetic field in the microwave band does not depend on the frequency and is equal to $\gamma_L$. This fact agrees to the law of London in the case of direct current.

(3) A Lumped Constant Equivalent Circuit Incorporating the Phase Constant of a Superconducting Multilayer Electrode Line As explained in section (2), the equivalent circuit of the superconductor can be expressed in the same way as that of the normal conductor by using the complex electrical conductivity. First, the one-dimensional equivalent circuit and the T-shape equivalent circuit of the superconductor are derived from the one-dimensional equivalent circuit and the T-shaped equivalent circuit of the normal conductor, respectively. Also, for designing of the superconducting multilayer electrode, a lumped constant circuit having a phase constant of the superconducting multilayer electrode incorporated therein is derived from a lumped constant circuit of a thin-film multilayer electrode of a normal conductor through a technique which is the same as for the thin-film multilayer electrode of the normal conductor. Based on this, a recurrence formula regarding the surface impedance having frequency dependence is obtained. Further, by normalization by a normalization factor $R_0$, the recurrence formula can be expressed in a dimensionless form.

(3-2) The One-dimensional Equivalent Circuit of the Superconductor

Figure 6:
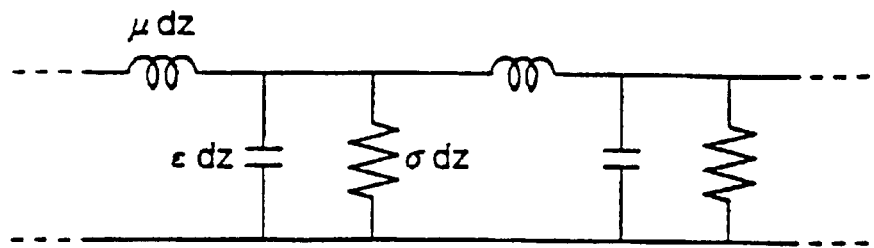
FIG. 6 is an equivalent circuit diagram of a normal conductor.

The equivalent circuit of the normal conductor through which plane waves propagate can be expressed as shown in FIG. 6 where $\mu$, $\in$, and $\sigma$ are the magnetic permeability, the dielectric constant, and the electrical conductivity, respectively, and $\mu dz$, $\in dz$ and $\sigma dz$ represent a series inductor, a shunt capacitor and a shunt resistor, respectively. The plane waves which propagate through the superconductor can be handled in a similar manner by replacing the electrical conductivity $\sigma$ of the normal conductor with the complex electrical conductivity $$\dot{\sigma}$$

where the complex electrical conductivity s is expressed as the following equation:

$$\dot{\sigma} \equiv \sigma_r - j\sigma_i \tag{31}$$

Figure 7:
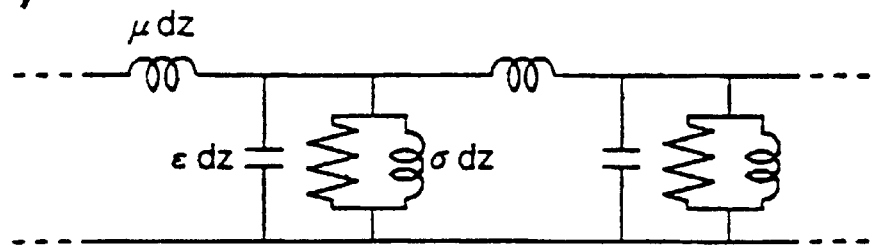
FIG. 7 is an equivalent circuit diagram of a superconductor.

Therefore, the equivalent circuit of the superconductor through which the plane waves propagate is expressed as shown in FIG. 7, where $\mu dz$ represents a series inductor and $\in dz$ $\sigma_r dz$ and $\sigma_i dz$ represent a shunt capacitor, a shunt resistor and a shunt inductor, respectively.

(3-3) The T-shaped Equivalent Circuit of the Superconductor

Figure 8:
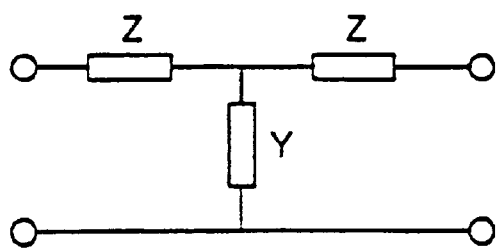
FIG. 8 is a T-shaped equivalent circuit diagram of a superconductor.

FIG. 8 shows a T-shaped equivalent circuit of a superconductor having a thickness of $\Delta\xi$. The respective circuit constants thereof are given by the following equations:

$$Z = Z_{s0} \tan h(\gamma\Delta\xi/2)$$

$$Y = 1/Z_{s0} \sin h(\gamma\Delta\xi) \tag{32}$$

However, the propagation constant $\gamma$ and the surface impedance $Z_{s0}$ of the superconductor are expressed as follows in a frequency lower than the microwave band (see section 2-4):

$$\gamma \equiv \alpha + j\beta \tag{33}$$
$$= 1/\lambda_L(1 + 2Q_c)$$

$$Z_{s0} = R_s + jX_s \tag{34}$$
$$= 1/\sigma_i(\beta + j\alpha)$$
$$= 1/\sigma_i\lambda_L(2Q_c + j)$$

where $\alpha$ and $\beta$ are the attenuation constant and the phase constant, respectively and $Q_c$ is the quality factor of the superconductor. The following relation can be satisfied with the penetration depth $\lambda_L$ of London:

$$\lambda_L = 1/\alpha \tag{35}$$

Also, $Q_c$ can be defined by the following equation:

$$Q_c = \beta/(2\alpha) = \sigma_r/(4\sigma_i) \tag{36}$$

Figure 9:
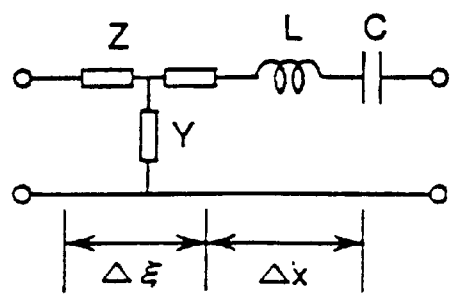
FIG. 9 is an equivalent circuit diagram of one element of a superconducting multilayer electrode.

(3-4) The Lumped Constant Circuit of the Superconducting Thin-film Multilayer Electrode Line By replacing the conductor part of the lumped constant circuit of the thin-film multilayer electrode line of the normal conductor with the equivalent circuit of the superconductor in the previous section, the lumped constant circuit of the superconducting thin-film multilayer electrode line shown in FIG. 9 can be obtained.

$$L = \mu_0(\Delta x/\Delta y)(1/\beta_0) \tag{37}$$

$$C = \in(\Delta y/\Delta x)(1/\beta_0) \tag{38}$$

$$Z = ((2Q_c + j)/\sigma_i\lambda_L)(1/\Delta y)(1/\beta_0)\tan h((1+j2Q_c)/2(\Delta\xi/\lambda_L)) \tag{39}$$

$$Y = (\sigma_i\lambda_L/(2Q_c + j))\Delta y\beta_0 \sin h((1+j2Q_c)/2(\Delta\xi/\lambda_L)) \tag{40}$$

$$\beta_0 = \omega_0\sqrt{(\mu_0\epsilon_m)} \tag{41}$$

In the above, in the case of the main line, $\in = \in_m$ is set, and in the case of the subline, $\in = \in_s$ is set. $\Delta y$ is the width of the line, and $\Delta x$ and $\Delta\xi$ are the thicknesses of the dielectric layer and the superconductor layer, respectively.

Figure 10:
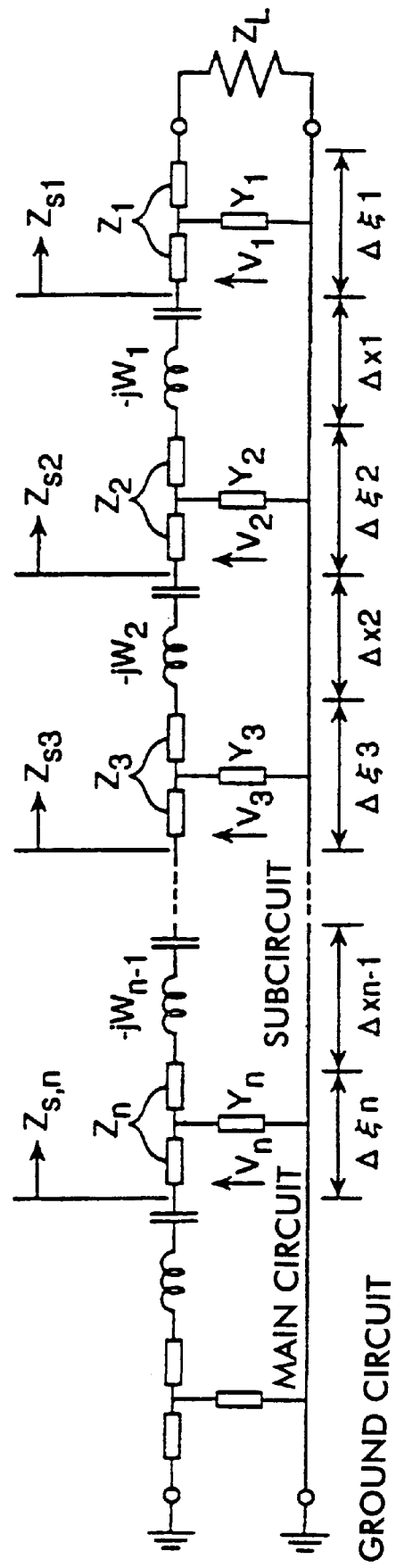
FIG. 10 is a diagram of a lumped constant circuit of a superconducting multilayer electrode.

(3-5) Recurrence Formula of Lumped Constant Circuit and the Normalization Thereof The lumped constant circuit of the multilayer electrode having n laminated layers is shown in FIG. 10. $Z_{s,k}$ shown in FIG. 10 indicates the surface impedance of the k-th layer counting from the topmost layer. The recurrence formula regarding $Z_{s,k}$ can be given by the following equations:

$$Z_{s,1} = Z_1 + (Y_1 + (Z_1 + Z_L)^{-1})^{-1} \tag{42}$$

$$Z_{s,k} = Z_k + (Y_k + (Z_k - jW_{k-1} + Z_{s,k-1})^{-1})^{-1} \quad (k=2,3,\ldots,n) \tag{43}$$

where $Z_L$ is the impedance of the vacuum layer and can be given by the following equations:

$$Z_L = \sqrt{(\mu_0/\epsilon_0)}(1/\Delta y)(1/\beta_0) \tag{44}$$

$W_k$ in equation (33) is defined by the following equation:

$$-jW_k \equiv j\omega L_k + 1/j\omega C_k \tag{45}$$

W$k$ can be transformed further into the following equation:

$$W_k = (1/\sigma_{i0}\lambda_L)(1/\Delta y)(1/\beta_0)(\Delta x_k/\lambda_L)((\omega_0/\omega)(\in_m/\in_s) - \omega/_{107\ 0}) \tag{46}$$

where $\sigma_{i0}$ is the imaginary part of the complex electrical conductivity when the angular frequency is $\omega_0$. According to the two-fluid model, $\sigma_i$ has the frequency dependence of the following equation:

$$\sigma_i = \sigma_{i0}(\omega_0/\omega) \tag{47}$$

When rewriting equation (45) to equation (46), the following relation is used:

$$\lambda_L = 1/\sqrt{(\omega\mu_0\sigma_i)} \tag{48}$$

$$\omega_0\mu_0 = 1/(\sigma_{i0}\lambda_L^2) \tag{49}$$

where $\lambda_L$ does not depend on the frequency.

The recurrence formula of equation (43) is now normalized as follows by using the normalization factor R0 expressed by the following equation:

$$R_0 = 1/(\sigma_{io}\lambda_L \Delta y \beta_0) \quad (50)$$

$$\hat{Z}_{s,k} = \hat{Z}_k + (\hat{Y}_k + (\hat{Z}_k - j\hat{W}_{k-1} + \hat{Z}_{s,k-1})^{-1})^{-1} \quad (k=2,3,\ldots,n) \quad (51)$$

where the ^ symbols mean the normalized quantities, and are defined by the following equations respectively:

$$\hat{Z}_k = (2Q_c + j)\omega_0/\omega \tan h((1+j2Q_c)/2\xi_k) \quad (52)$$

$$\hat{Y}_k = 1/2Q_c + j\omega/\omega_0 \sin h((1+j2Q_c)\xi_k) \quad (53)$$

$$\hat{W}_k = x_k((\omega_0/\omega)(\in_m/\in_s) - \omega/\omega_0) \quad (54)$$

$$\hat{Z}_L = \sqrt{\sigma_{io}/(\omega_0 \epsilon_0)} \quad (55)$$

$$\xi_k = \Delta\xi/\lambda_L, \; x_k = x_k/\lambda_L \quad (56)$$

In the above equations, $Q_c$ has the frequency dependence of the following equation:

$$Q_c = Q_{c0}(\omega/\omega_0) \quad (57)$$

When, in particular, $\omega = \omega_0$, equations (52) to (54) become the following equations, respectively:

$$\hat{Z}_k = (2Q_{c0} + j)\tan h((1+j2Q_{c0})/2\xi_k) \quad (58)$$

$$\hat{Y}_k = 1/(2Q_{c0} + j)\sin h((1+j2Q_{c0})\xi k) \quad (59)$$

$$\hat{W}_k = x_k(\in_m/\in_s - 1) \quad (60)$$

The above-described analysis makes it possible to derive the one-dimensional equivalent circuit and the T-shaped equivalent circuit of the superconductor from the one-dimensional equivalent circuit and the T-shaped equivalent circuit of the normal conductor. Also, the lumped constant circuit of the superconducting multilayer electrode is derived from the lumped constant circuit of the thin-film multilayer electrode of the normal conductor. Based on this, a recurrence formula regarding surface impedance having frequency dependence is obtained. Further, by normalization by the normalization factor R0, it is possible to express the recurrence formula in a dimensionless form.

(4) Designing of the Optimum Film Thickness for Increasing the Resistance to Electric Power of the Superconducting Multilayer Electrode When a superconductor is used as an electrode of high-frequency parts, such as filters, it is possible to reduce the loss in the electrode. However, in the superconducting electrode, there is a problem in that the electric power which can be applied is limited because of its critical current. This is the greatest problem for putting the superconducting electrode into practical use. As means for solving this problem, a superconducting multilayer electrode in which superconductors and dielectrics are alternately laminated is proposed. As a method of analyzing the superconducting multilayer electrode, an equivalent circuit thereof has already been derived in section (2). Here, a method of designing the optimum film thickness of the superconducting multilayer electrode by using the equivalent circuit is derived. In the multilayer electrode of a normal conductor, a design method in which the surface resistance reaches a minimum has already been derived in section (3). However, in that design method, since the current density becomes high locally, the design method is not suitable for increasing the resistance to electric power of the superconducting multilayer electrode. Here, by using the lumped constant circuit and the recurrence formula obtained in sections (2) and (3), the optimum film thickness for making the largest current flow within the range not exceeding the critical current density is derived from the analytical technique from a point of view of increasing the resistance to electric power.

(4-2) The Equivalent Circuit of the Superconducting Multilayer Electrode

The lumped constant equivalent circuit of the superconducting multilayer electrode having n laminated layer can be expressed as shown in FIG. 10 as is derived in section (3). Here, it is assumed that $(\omega\tau)^2 \ll 1$ and $(\sigma_r/\sigma_i) \ll 1$. The respective circuit constants at the designed center frequency are given by the following equations:

$$Z_k = (2Q_{c0} + j)\tan h((1+j2Q_{c0})/2\xi_k) \quad (61)$$

$$Y_k = 1/(2Q_{c0} + j)\sin h((1+j2Q_{c0})\xi_k) \quad (62)$$

$$W_k = x_k(\in_m/\in_s - 1) \quad (63)$$

$$Z_L = \sqrt{\sigma_{io}/(\omega_0 \epsilon_0)} \quad (64)$$

$$\xi_k = \Delta\xi_k/\lambda_L, \; x_k = \Delta x_k/\lambda_L \quad (65)$$

$$Q_c = \sigma_r/(4\sigma_i), \; Q_c = Q_{c0}\omega/\omega_0 \quad (66)$$

$$\dot{\sigma} = \sigma_r - j\sigma_i \quad (67)$$

where $\Delta x_k$ and $\Delta \xi_k$ are the thicknesses of the dielectric layer and the superconductor layer of the k-th layer, respectively, $\dot{\sigma}$ and $\lambda_L$ are the complex electrical conductivity and the penetration depth of London of the superconductor, respectively, and $\in_m$ and $\in_s$ are the dielectric constants of the main line and the subline, respectively. With $\Delta y$ as the width of the line, each circuit constant is normalized by the normalization factor R0 expressed by the following equation:

$$R_0 = 1/(\sigma_{io}\lambda_L \Delta y \beta_0) \quad (68)$$

The surface impedance $Z_{s,k}$ when the above is seen from the underside of the k-th (k=1 to n) layer can be determined from the following recurrence formulas:

$$Z_{s,1} = Z_1 + (Y_1 + (Z_1 + Z_L)^{-1})^{-1} \quad (k=1) \quad (69)$$

$$Z_{s,k} = Z_k + (Y_k + (Z_k - jW_{k-1} + Z_{s,k-1})^{-1})^{-1} \quad (k=2,3,\ldots,n) \quad (70)$$

(4-3) The Optimum Conditions

The optimum conditions for increasing the resistance to electric power of the superconducting multilayer electrode will now be considered.

Maximizing the resistance to electric power maximizes the electric current which flows through the entire multilayer electrode within the range which does not exceed the critical current density $J_c$ in any portion of the inside of the superconductor.

A superconductor layer of a single layer having a predetermined film thickness is now considered. Generally speaking, the current density distribution along the film thickness inside the superconductor layer is nonuniform, and a maximum current density $J_{max}$ is present at a certain portion. Therefore, the electric current which can be made to flow through this superconductor layer is limited by the condition: $J_c > J_{max}$.

Next, a case in which the number of laminated layers is two will be described. In this case, it is assumed that the maximum current density is present in each layer, and is denoted as $J_{1'max}$ and $J_{2'max}$, respectively. When electric current is made to flow through these two layers, since any one of $J_{1'max}$ and $J_{2'max}$ must not exceed $J_c$, the current density is limited by the larger value of $J_{1'max}$ and $J_{2'max}$. For example, if $J_{1'max} > J_{2'max}$, there is room for electric current which can be made to flow through the second layer, and the maximum electric current is not made to flow. Therefore, to make the maximum electric current flow through the two layers, $J_{1'max} = J_{2'max}$ should be set.

The same applies as well to the case in which the number of laminated layers is n. A first optimum condition is expressed by the following equation:

$$J_{1'max} = J_{2'max} = \ldots = J_{n'max} \quad (71)$$

Further, another condition is such that, in addition to satisfying the above condition, the electric current $I_{tot}$ which flows through the entire multilayer electrode is maximized.

$$I_{tot} \Rightarrow \max \quad (72)$$

This equation indicates that $I_{tot}$ is made to the maximum value which it can assume.

Further, the conditions of equations (11) and (12) are rewritten to expressions which are a little more easy to analyze. It has been confirmed by circuit simulation that the current density distribution inside one certain superconductor layer of the multilayer electrode reaches a maximum on the underside (the side close to the main line) interface of the layer. The following relation holds between the current density J and the electric-field intensity E:

$$E = \dot{\sigma} J \quad (73)$$

Since the complex electrical conductivity is constant regardless of the place, J is proportional to E. Therefore, the condition of equation (71) can be rewritten to the following equation with the electric-field intensity of the underside interface of the k-th layer as $E_{s,k}$:

$$E_{s,1} = E_{s,2} = \ldots = E_{s,n} \quad (74)$$

Also, since the electric current Itot which flows through the entire multilayer electrode is inversely proportional to the surface impedance $Z_{s,tot}$ when the entire multilayer electrode is seen from the main line, the condition of equation (72) can be rewritten to the following equation:

$$Z_{s,tot} \Rightarrow \min \quad (75)$$

Next, the conditions of equation (74) and (75) are rewritten to the conditions on the equivalent circuit. The electric field of the real model corresponds to the voltage on the equivalent circuit, and the surface impedance corresponds to the impedance. Therefore, the conditions of equation (74) and (75) can be rewritten to the following equations, respectively:

$$|V_1| = |V_2| = \ldots = |V_n| \quad (76)$$

$$|Z_{s,n}| \Rightarrow \min \quad (77)$$

The optimum conditions expressed by the equations (76) and (77) are such that the recurrence optimum conditions of the equation described below are satisfied for each layer in sequence from the second layer:

$$|V_k| = |V_{k-1}| \quad (78)$$

$$|Z_{s'k}| \Rightarrow \min \quad (k = 2, 3, \ldots, n) \quad (79)$$

Equations (78) and (79) are the obtained optimum conditions.

(4-4) General Solutions

Figure 11:
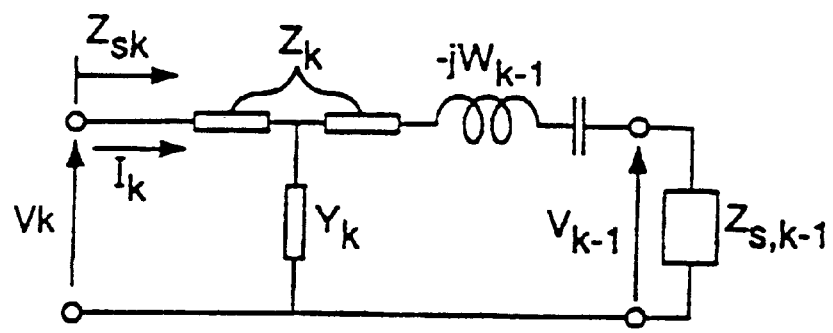
FIG. 11 is an equivalent circuit diagram of the k-th and above layers of the superconducting multilayer electrode.

FIG. 11 shows an equivalent circuit of the k-th (k=2, 3, ..., n) and above layers. The relation between $V_k$ and Vk−1 is given by the following equation:

$$V_{k-1} = Z_{s,k-1} / \{Z_k + (1 + Z_k Y_k)(Z_{s,k-1} + Z_{k-j} W_{k-1})\} V_k \quad (80)$$

Therefore, the following equation can be obtained from the condition of equation (78):

$$|Z_{s,k-1}| = |Z_k + (1 + Z_k Y_k)(Z_{s,k-1} + Z_{k-j} W_{k-1})| \quad (81)$$

Also, the absolute value of impedance $Z_{s'k}$ when the above is seen from the underside of the k-th layer can be expressed as the following equation on the basis of equation (70):

$$|Z_{s,k}| = |Z_{s,k-1}| / |1 + Y_k(Z_{s,k-1} + Z_{k-j} W_{k-1})| \quad (82)$$

Since the numerator on the right side of equation (82) is equal to the right side of equation (8), it can be rewritten to the following equation:

$$|Z_{s'k}| = |Z_{s'k-1}| / |1 + Y_k(Z_{s'k-1} + Z_{k-j} W_{k-1})| \quad (83)$$

Since $Z_{s'k31\ 1}$ is considered under the fixed condition, to minimize the $Z_{s'k}$, the denominator of the right side of equation (83) should be maximized. Therefore, the condition of equation (89) becomes the following equation:

$$|1 + Y_k(Z_{s,k-1} + Z_{k-j} W_{k-1})| \Rightarrow \max \quad (84)$$

Therefore, the combination of the superconductor film thickness and the dielectric film thickness which minimizes equation (84) under the condition of equation (81) is the optimum film thickness. However, since the expression equation of $Z_k$ and $Y_k$, which is the function of the superconductor film thickness $\xi_k$, is a complicated complex function, it is difficult to solve this generally.

When these conditions are satisfied, the electric current which flows through the first layer is equal to the electric current in the case of a single layer. Therefore, the rate of increase $I_{up}$ of electric current with respect to a single layer can be determined on the basis of the following equation:

$$I_{up} = |I_n|/|I_1| = |Z_{s,1}|/|Z_{s,n}| \quad (85)$$

If it is assumed that the characteristic impedance $Z_0$ of the transmission line (the main line) is constant, the transmission power is given by the following equation:

$$P_{up} = Z_0 I_n^2 \quad (86)$$

Therefore, the rate of increase $P_{up}$ of electric power becomes the following equation:

$$P_{up} = I_{up}^2 \quad (87)$$

(4-5) Approximate Solutions

It is assumed that $(\omega\tau)^2 \ll 1$ and $(\sigma_r/\sigma_i) \ll 1$. This corresponds to a frequency in the microwave band or lower and a temperature sufficiently lower than the transition temperature. This condition, though this depends on the superconducting material, is satisfied at a low frequency of, for example, around 10 GHz or lower. At this time, an approximation can be made as $Q_c \ll 1$. $Z_k$ and $Y_k$ become the following equations and can be taken as purely imaginary numbers.

$$Z_k = j \tan h(½\xi_k) \quad (88)$$

$$Y_k = -j \sin h(\xi_k) \quad (89)$$

On the basis of the above-described approximation, an approximate solution of the optimum condition expressed by equations (88) and (89) will be determined.

The first layer will be considered first. To make the largest current flow through the first layer, the film thickness of the superconductor layer should be sufficiently thick. If $x_1 \to \infty$ is set, $$Z_1 = j, \; Y_1 = -j\infty \quad (90)$$

and $Z_s$ becomes a purely imaginary number as shown in the following equation:

$$Z_{s1} = j \quad (91)$$

Also, since $Z_k$ and $Y_k$ are purely imaginary numbers as can be seen from equations (88) and (89), if $Z_{s,k-1}$ is a purely imaginary number, $Z_{s,k}$ also becomes a purely imaginary number on the basis of equation (70). Therefore, $Z_{s,k}$ is always a purely imaginary number and can be expressed as the following equation:

$$Z_{s,k} = jX_{s,k} \quad (92)$$

Based on the above, equations (81) and (83) can be expressed as the following equations by removing the absolute values on both sides thereof:

$$Z_{s,k-1} = Z_k + (1+Z_kY_k)(Z_{s,k-1}+Z_{k-j}W_{k-1}) \quad (93)$$

$$Z_{s,k} = Z_{s,k-1}/\{1+Y_k(Z_{s,k-1}+Z_{k-j}W_{k-1})\} \quad (94)$$

Further, when equation (93) is transformed and substituted in equation (94), the following equation can be obtained:

$$Z_{s,k} = Z_{s,k-1}(1+Z_kY_k)/(1+Z_{s,k-1}Y_k) \quad (95)$$

Substitution of equations (88), (89) and (92) in equation (95) gives the following equation:

$$X_{s,k} = X_{s,k-1} \cos h(\xi_k)/\{1+X_{s,k-1}\sin h(\xi_k)\} \quad (96)$$

In the above, the relation of the following equation is used for this transformation:

$$1+\tan h(x/2)\sin h(x) = 1+2\sin h^2(x/2) = \cos h(x) \quad (97)$$

To minimize equation (96), this equation should be differentiated by $x_k$ to become zero:

$$\partial X_{s,k}/\partial \xi_k = X_{s,k-1}\{\sin h(\xi_k) - X_{s,k-1}\}/(1+X_{s,k-1}\sin h(\xi_k))^2 \quad (98)$$

Since equation (98) becomes zero, $\xi_k$ is determined as follows:

$$\xi_k = \sin h^{-1}(X_{s,k-1}) \quad (99)$$

Also, when equation (99) is substituted in equation (96) and transformed, the following recurrence formula of $X_{s,k}$ can be obtained:

$$1/X_{s,k}^2 = 1 + 1/X_{s,k-1}^2 \quad (100)$$

Since $X_{s1} = 1$, the recurrence formula can be solved analytically to give the following equations:

$$X_{s,k} = 1/\sqrt{k} \quad (101)$$

$$\xi_k = \sinh^{-1}(1/\sqrt{(k-1)}) \quad (102)$$

$$Z_k = j(\sqrt{k} - \sqrt{(k-1)}) \quad (103)$$

$$Y_k = -j1/\sqrt{(k-1)} \quad (104)$$

$$Z_{s,k} = j1/\sqrt{k} \quad (105)$$

$W_{k-1}$ is determined on the basis of the following equation by transforming equation (83):

$$W_{k-1} = -jZ_k\{2+(Z_{s,k-1}+Z_k)Y_k\}/(1+Z_kY_k) \quad (106)$$

By substituting equations (103), (104), and (105) in equation (106) and arranging it, the following equation can be obtained:

$$W_k = X_{s,k} = 1/\sqrt{k} \quad (107)$$

On the basis of this $W_k$, $x_k$ can be determined by the following equation:

$$x_k = W_k(\epsilon_m/\epsilon_s - 1)^{-1} \quad (108)$$
$$= 1/\sqrt{k}(\epsilon m/\epsilon s - 1)^{-1}$$

The rate of increase $I_{up}$ of electric current becomes the following equation by substituting equation (105) in equation (85):

$$I_{up} = \sqrt{n} \quad (109)$$

The rate of increase $P_{up}$ of electric power becomes the following equation on the basis of equation (87):

$$P_{up} = n \quad (110)$$

That is, since the voltages $V_k$ of the superconductors of n layers are made the same and the current densities can be made the same, the whole electric current is increased by $\sqrt{n}$ times. As a result, the resistance to electric power also increases by n times. If, for example, n=5 is set, the resistance to electric power increases by 5 times.

(4-6) Summary

The optimum condition for increasing the resistance to electric power of the superconducting multilayer electrode is to minimize the absolute value of the surface impedance $Z_{s'n}$ under the condition in which the absolute value of the voltage of the underside interface of each superconductor layer is made constant.

At a frequency of around 1 GHz or lower, $Q_c \ll 1$, and it can be assumed that the surface impedance is a purely imaginary number, and the propagation constant is a real number. At that time, the optimum values of the thickness $\Delta\xi_k$ of the superconductor layer of the k-th layer and the thickness $\Delta\xi_k$ of the dielectric layer of the k-th layer, and the rate of increase of electric current, are given in an approximate manner by the following equations, where $\epsilon_m$ is the dielectric constant of the substrate, and $\in_s$ is the dielectric constant of the dielectric layer of the electrode:

$$\Delta \xi_1 = \infty \quad (111)$$

$$\Delta \xi_k = \lambda_L \sinh^{-1}\left(1/\sqrt{(k-1)}\right) \quad (k = 2, 3, \ldots, n) \quad$$

$$\Delta X_k = \lambda_L / (\epsilon_m / \epsilon_s - 1) \sqrt{k} \quad (112)$$

$$I_{up} = \sqrt{n} \quad (109)$$

$$P_{up} = n \quad (110)$$

Table 5 shows the designed values of the optimum film thicknesses of the superconductor layer and the dielectric layer when $(\omega\tau)^2 \ll 1$ and $(\sigma_r/\sigma_i) \ll 1$ (the frequency is around 1 GHz or lower) where k is the position of the laminated layers, $x_k$ is the thickness $(=\Delta_k/\lambda_L)$ such that the thickness $\Delta \xi_k$ of the k-th superconductor layer is normalized by the magnetic-field penetration depth $\lambda_L$, and in the dimensionless parameter $W_k$, $x_k$ is the thickness of the dielectric layer of the k-th layer. Here, the optimum design characteristics up to n=50 are shown. For example, when n=5, a value of k_5 is used in Table 5.

TABLE 5

Designed values of the optimum film thicknesses of the superconductor layers and dielectric layers

| k | $\xi_k$ | $W_k = X_k(\epsilon_m/\epsilon_s - 1)$ |
|---|---|---|
| 1 | ∞ | 1.0000 |
| 2 | 0.8814 | 0.7071 |
| 3 | 0.6585 | 0.5774 |
| 4 | 0.5493 | 0.5000 |
| 5 | 0.4812 | 0.4472 |
| 6 | 0.4335 | 0.4082 |
| 7 | 0.3977 | 0.3780 |
| 8 | 0.3695 | 0.3536 |
| 9 | 0.3466 | 0.3333 |
| 10 | 0.3275 | 0.3162 |
| 11 | 0.3112 | 0.3015 |
| 12 | 0.2971 | 0.2887 |
| 13 | 0.2848 | 0.2774 |
| 14 | 0.2739 | 0.2673 |
| 15 | 0.2642 | 0.2582 |
| 16 | 0.2554 | 0.2500 |
| 17 | 0.2475 | 0.2425 |
| 18 | 0.2402 | 0.2357 |
| 19 | 0.2336 | 0.2294 |
| 20 | 0.2274 | 0.2236 |
| 21 | 0.2218 | 0.2182 |
| 22 | 0.2165 | 0.2132 |
| 23 | 0.2116 | 0.2085 |
| 24 | 0.2070 | 0.2041 |
| 25 | 0.2027 | 0.2000 |
| 26 | 0.1987 | 0.1961 |
| 27 | 0.1949 | 0.1925 |
| 28 | 0.1913 | 0.1890 |
| 29 | 0.1879 | 0.1857 |
| 30 | 0.1846 | 0.1826 |
| 31 | 0.1816 | 0.1796 |
| 32 | 0.1787 | 0.1768 |
| 33 | 0.1759 | 0.1741 |
| 34 | 0.1732 | 0.1715 |
| 35 | 0.1707 | 0.1690 |
| 36 | 0.1682 | 0.1667 |
| 37 | 0.1659 | 0.1644 |
| 38 | 0.1637 | 0.1622 |
| 39 | 0.1615 | 0.1601 |
| 40 | 0.1595 | 0.1581 |
| 41 | 0.1575 | 0.1562 |
| 42 | 0.1555 | 0.1543 |
| 43 | 0.1537 | 0.1525 |
| 44 | 0.1519 | 0.1508 |

TABLE 5-continued

Designed values of the optimum film thicknesses of the superconductor layers and dielectric layers

| k | $\xi_k$ | $W_k = X_k(\epsilon_m/\epsilon_s - 1)$ |
|---|---|---|
| 45 | 0.1502 | 0.1491 |
| 46 | 0.1485 | 0.1474 |
| 47 | 0.1469 | 0.1459 |
| 48 | 0.1454 | 0.1443 |
| 49 | 0.1438 | 0.1429 |
| 50 | 0.1424 | 0.1414 |

(5) Method of Designing Superconducting Multilayer Electrode

Figure 12:
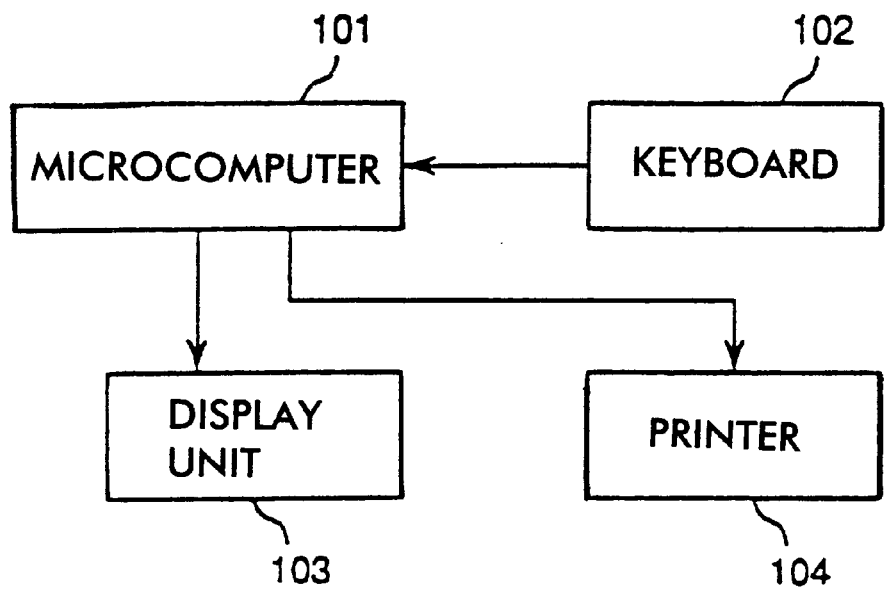
FIG. 12 is a block diagram of an optimum film thickness setting apparatus.

FIG. 12 is a block diagram illustrating the construction of an optimum film-thickness setting apparatus for calculating and outputting the normalized superconductor film thickness $\xi_k$ and the normalized dielectric film thickness $X_k$ for maximizing the above-described resistance to electric power. The optimum film-thickness setting apparatus comprises a microcomputer 101, a keyboard 102, a display unit 103, and a printer 104. The microcomputer 101 executes an optimum film-thickness setting calculation process. The keyboard 102 is an input device for inputting predetermined input parameters, and a normalized film thickness $\xi_1$ of the thin-film superconductor of the first layer, and input data is output to the microcomputer 101. The display unit 103 displays the calculated results of conductor film thicknesses $\xi_1$ to $\xi_n$, film thicknesses $x_1$ to $x_n$, normalized surface impedances $Z_{s1}$ to $Z_{sn}$, and Q increase rate RQ. The printer 104 prints the calculated results displayed on the display unit 103. A description will be given below of the optimum film-thickness setting calculation process which is performed by the optimum film-thickness setting calculation processing apparatus.

FIGS. 13, 14, and 15 are flowcharts of an optimum film-thickness setting calculation processing program to be executed by the optimum film-thickness setting calculation processing apparatus of FIG. 12. FIG. 13 shows a flowchart of a program for designing the optimum film thickness without using the approximation conditions from a physical point of view. In step S2, after start of the process in the Start step, step S1 designated input parameters described below are input. Here, the designated parameters are the following four parameters: (1) the dielectric constant $\in_m$ of the substrate (the main line), (2) the dielectric constant $\in_s$ of each thin-film dielectric (the subline) 30–k, (3) the complex electrical conductivity σ of the superconductor k, and (4) the penetration depth $\lambda_L$ of London of each thin-film superconductor. Here, the electrical conductivity σ of each of the superconductors k is set at the same value, and the dielectric constants $\in_s$ of each of the thin-film dielectrics 30–k is set at the same value. Next, in step S4, the impedance $Z_L$ of the vacuum layer is determined on the basis of the outer-side medium. The impedance $Z_L$ is a normalized impedance of the air layer when the air layer is seen from the underside of the thin-film superconductor 1 of the topmost layer.

Next, in order to make a calculation for the first layer, in step S6, k=1 is set. And, in step S8, the normalized film thickness $\xi_1$ of the superconductor of the first layer is determined so that $$Z_{s1} \to \min \quad (111)$$

where $Z_{s1}$ is the surface impedance when the above is seen from the first layer.

Next, by using a recurrence formula, the film thicknesses of each superconductor and each dielectric are determined.

First, in step S10, the surface impedance $Z_{s1}$ is determined on the basis of:

$$Z_{s1}=Z_{s1}(\xi_1, Z_L) \qquad (112)$$

Then, in step S12, k is increased by 1. In step S14, under the condition:

$$\text{Max}(J_k)=\text{Max}(J_1) \qquad (113)$$

in which the maximum value of the current density (the function of the position along the thickness) inside each layer is the same, the film thickness $x_{k-1}$ of the dielectric of the (k−1)th layer and the film thickness $\xi_k$ of the superconductor of the k-th layer are determined so that:

$$Z_{sk} \rightarrow \min \qquad (114)$$

Next, in step S16, the surface impedance $Z_{sk}$ is determined on the basis of:

$$Z_{sk}=Z_{sk}(x,\xi_k,Z_{sk-1}) \qquad (115)$$

where $Z_{sk}$ is the surface impedance when the above is seen from the k-th layer. In step S18 it is determined whether film thickness up to the n-th layer have been determined. If NO, the process returns to step S12, and the film thicknesses of the next dielectric and superconductor are determined.

If YES, that is when it is determined in step S18 that the film thicknesses have been determined up to the n-th layer, the process proceeds to step S20 where the improvement rate RP of resistance to electric power is calculated on the basis of the following equation:

$$RP=(Z_{s1}/Z_{sn})^2 \qquad (116)$$

where n is the number of sub-transmission lines LNk which are formed in such a way that the thin-film conductor k and the thin-film dielectric 30−k are alternately laminated. Next, in step S22, superconductor film thicknesses $\xi_1$ to $\xi_n$, dielectric film thicknesses xl to $x_{n-1}$, normalized surface impedances $Z_{s1}$ to $Z_{sn}$, and the improvement rate of resistance to electric power are displayed on the display unit. Then, the process proceeds to step S24 where these values are printed, and the optimum film-thickness setting program is terminated in the End step, step S26.

FIG. 14 shows a flow of a program for designing the optimum film thickness by using the expression of general solutions based on the equivalent circuit explained earlier in section (4). It is assumed that:

$$(\omega\tau)^2 \ll 1 \qquad (117)$$

$$(\sigma_r/\sigma_i)^2 \ll 1 \qquad (118)$$

That is, the frequency is low (around the microwaves), and the temperature is sufficiently lower than the transition temperature $T_c$. In step 102, after start of the process in the Start step, step 100, designated input parameters are input. Here, the designated parameters are the following four parameters: (1) the dielectric constant $\in_m$ of the substrate (the main line), (2) the dielectric constant $\in_s$ of each thin-film dielectric (the subline) 30−k, (3) the complex electrical conductivity s of the superconductor k, and (4) the penetration depth $\lambda_L$ of London of each thin-film superconductor. Here, the electrical conductivity a of each of the superconductors k is set at the same value, and the dielectric constants $\in_s$ of each of the thin-film dielectrics 30−k is set at the same value. Next, in step S104, the impedance $Z_L$ of the vacuum layer is determined on the basis of the outer-side medium. The impedance $Z_L$ is a normalized impedance of the air layer when the air layer is seen from the underside of the thin-film superconductor 1 of the topmost layer.

Next, in order to make a calculation for the first layer, in step S106, k=1 is set. And, in step S108, the normalized film thickness $\xi_1$ of the superconductor of the first layer is determined so that $$Z_{s1} \rightarrow \min \qquad (119)$$

where $Z_{s1}$ is the surface impedance when the above is seen from the first layer.

Next, the film thicknesses of each superconductor and each dielectric will be determined by using a recurrence formula. First, in step S110, the surface impedance $Z_{s1}$ is determined on the basis of equation (69):

$$Z_{s1}=Z_{s1}(\xi_1, Z_L) \qquad (120)$$

Then, in step S112, k is increased by 1. In step S114, under the condition:

$$|V_1|=|V_k| \qquad (121)$$

in which the voltage (from a physical point of view, the current density on the bottommost surface of each superconductor) on the equivalent circuit is the same, the film thickness $X_{k-1}$ of the dielectric of the (k−1)th layer and the film thickness $\xi_k$ of the superconductor of the k-th layer are determined on the basis of equation (84) so that:

$$Z_{sk} \rightarrow \min \qquad (122)$$

Next, in step S116, the surface impedance $Z_{sk}$ is determined on the basis of equation (70):

$$Z_{sk}=Z_{sk}(x, \xi_k, Z_{sk-1}) \qquad (123)$$

where $Z_{sk}$ is the surface impedance when the above is seen from the k-th layer. In step S118 it is determined whether film thickness up to n-th layer have been determined, i.e., whether n=k the process returns to step S112 et seq. where the film thicknesses of the next dielectric and superconductor are determined.

If YES, that is, when it is determined in step S118 that the film thicknesses up to the n-th layers have been completely determined, then the process proceeds to step S120 where the resistance-to-electric-power improvement rate RP is calculated on the basis of the following equation:

$$RP=(Z_{s1}/Z_{sn})^2 \qquad (124)$$

where n is the number of sub-transmission lines LNk which are constructed in such a way that a thin-film conductor k and a thin-film dielectric 30−k are alternately laminated. Next, in step S122, superconductor film thicknesses $\xi_1$ to $\xi_n$, dielectric film thicknesses $x_1$ to $x_{n-1}$, normalized surface impedances $Z_{s1}$ to $Z_{sn}$, and the improvement rate of resistance to electric power are displayed on the display unit. Then, the process proceeds to step S124 where these values are printed, and the optimum film-thickness setting program is terminated in End step, step S126.

When the above-described approximation conditions are not satisfied, the thin-film designing method employing an equivalent circuit which is described in section (4) cannot be applied. However, designing is possible by a simulator using the circuit constants described below. The design flow in this case is the same as that shown in FIG. 13. Here, the following two constants can be obtained by transforming equations (32), (39), and (40).

$$Z_k = Z_{s0}(1/\Delta y)(1/\beta_0)\tan h(\gamma\Delta\zeta_k/2) \qquad (125)$$

$$Y_k = (1/Z_{s0})\Delta y\beta_0\sin h(\gamma\Delta\zeta_k) \qquad (126)$$

The following five constants $L_k$, $C_k$, $\gamma$, $Z_{s0}$, and $\beta_0$ are the same as those of equations (37), (38), (77), (80) and (41).

FIG. 15 shows a flowchart of a program for designing the optimum film thickness by using an expression of an approximation solution through the use of an equivalent circuit which was explained earlier in section (4). It is assumed that:

$$(\omega\tau)^2 \ll 1 \qquad (127)$$

$$(\sigma_r/\sigma_i)^2 \ll 1 \qquad (128)$$

That is, the frequency ω is low (a frequency in around the microwave band or lower; however, it depends on the material and temperature), and the temperature is sufficiently lower than the transition temperature. In step 202, after start of the process in the Start step, step S200 designated input parameters described below are input. Here, the designated parameters are the following four parameters: (1) the dielectric constant $\in_m$ of the substrate (the main line), (2) the dielectric constant $\in_s$ of each thin-film dielectric (the subline) 30–k, (3) the complex electrical conductivity σ of the superconductor k, and (4) the penetration depth $\lambda_L$ of London of each thin-film superconductor. Here, the electrical conductivity σ of each of the superconductors k is set at the same value, and the dielectric constant $\in_s$ of each of the thin-film dielectrics 30–k is set at the same value. Next, in step S204, the impedance $Z_L$ of the vacuum layer is determined on the basis of the outer-side medium. The impedance $Z_L$ is a normalized impedance of the air layer when the air layer is seen from the underside of the thin-film superconductor 1 of the topmost layer.

Next, in order to make a calculation for the first layer, in step S206, k=1 is set. And, in step S208, the normalized film thickness $\xi_1$ of the superconductor of the first layer is determined assuming that the film thickness is sufficiently thick ($\xi_1 = \infty$) so that $$Z_{s1} \rightarrow \min \qquad (129)$$

where $Z_{s1}$ is the surface impedance when the above is seen from the first layer.

Next, using a recurrence formula, the film thicknesses of each superconductor layer and each dielectric layer are determined. Initially, in step S210, the surface reactance Xs1 is determined on the basis of equation (91):

$$Z_{s1} = jX_{s1} = j \qquad (130)$$

Then, in step S212, k is increased by 1. In step S214, the film thickness $x_{k-1}$ of the dielectric of the (k-1)th layer and the film thickness $\xi_k$ of the superconductor of the k-th layer are determined on the basis of equations (99), (117), and (118), and $$\xi_k = \sin h^{-1}(X_{sk-1}) \qquad (131)$$

$$W_{k-1} = X_{sk-1} \qquad (132)$$

$$x_{k-1} = W_{k-1}(\in_m/\in_s - 1)^{-1} \qquad (133)$$

Next, in step S216, the surface reactance $X_{sk}$ is determined on the basis of equation (110), and $$X_{sk} = (1 + 1/X_{sk-1}^2)^{1/2} \qquad (134)$$

where $X_{sk}$ is the imaginary part of the surface impedance when the above is seen from the k-th layer. In step S218 it is determined whether film thickness up to the n-th layer have been determined, i.e., whether n=k the process returns to step S212 et seq. where the film thicknesses of the next dielectric and superconductor are determined.

If YES, that is, when it is determined in step S218 that the film thicknesses up to the n-th layers have been completely determined, the process proceeds to step S220 where the resistance-to-electric-power improvement rate RP is calculated on the basis of the following equation:

$$RP = (Z_{s1}/Z_{sn})^2 \qquad (135)$$

where n is the number of sub-transmission lines LNk which are constructed in such a way that a thin-film conductor k and a thin-film dielectric 30–k are alternately laminated. Next, in step S222, superconductor film thicknesses $\xi_1$ to $\xi_n$, dielectric film thicknesses $x_1$ to $x_{n-1}$, normalized surface impedances $Z_{s1}$ to $Z_{sn}$, and the improvement rate of resistance to electric power are displayed on the display unit. Then, the process proceeds to step S224 where these values are printed, and the optimum film-thickness setting program is terminated in the End step, step S226.

Based on the superconductor film thicknesses $\xi_k$ and the dielectric film thicknesses $x_k$ which are calculated in the above-described way, a thin-film conductor is formed on the top surface of the dielectric substrate 10 provided with the ground conductor 11 on the underside thereof by making a superconducting material, such as a YBCO type material, successively stacked until it has a calculated film thickness by using a sputtering apparatus. Then, on the top surface thereof, a dielectric material, such as $SiO_2$, is stacked successively until it has a calculated film thickness by using a sputtering apparatus, thus forming a thin-film dielectric. In a similar manner, the thin-film conductors k and the thin-film dielectrics 30–k are formed alternately up to the thin-film conductor 1 of the topmost layer. In this way, a superconducting multilayer line having an optimum film thickness can be formed. Although a sputtering apparatus is used to deposit each of the thin-film conductors k and each of the thin-film dielectrics 30–k, other thin-film forming apparatus, such as a vapor deposition apparatus, or a plasma CVD apparatus, may be used.

(6) Influence of deviation of the Film Thickness from the Optimum Value

Figure 16:
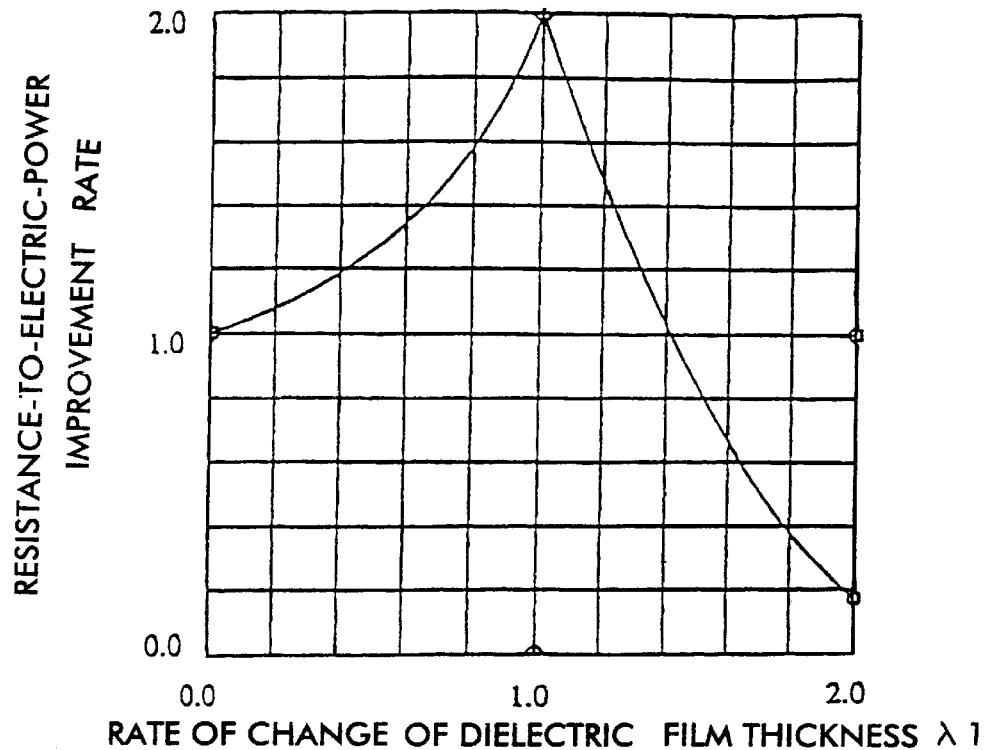
FIG. 16 is a graph of changes of the resistance-to-electric-power improvement rate when the dielectric film thickness $x_1$ varies in the case of n=2.
Figure 17:
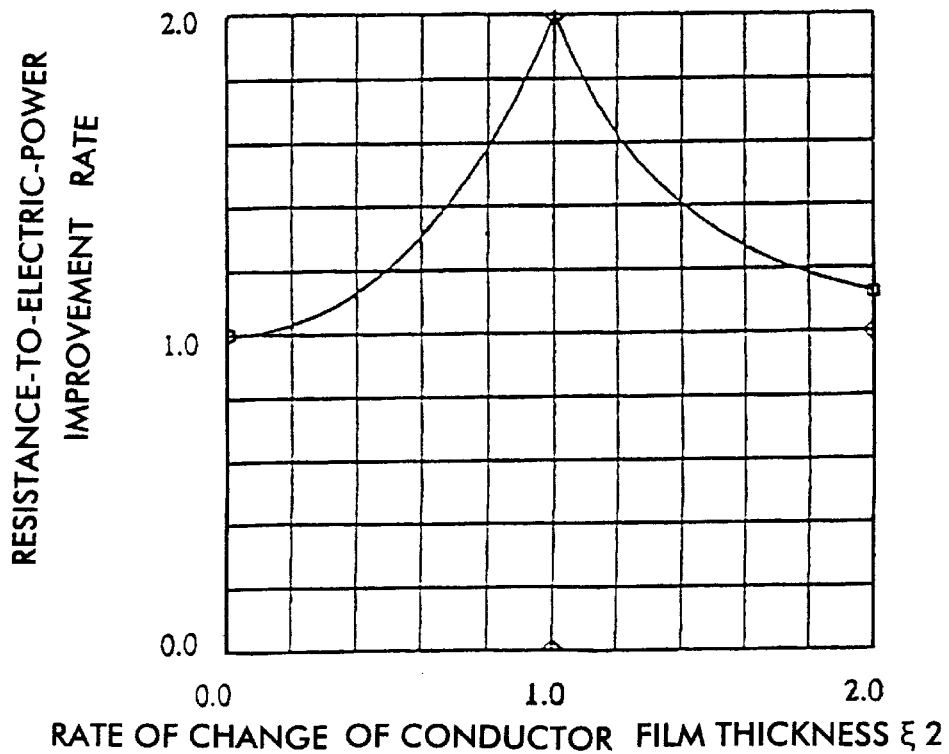
FIG. 17 is a graph of changes of the resistance-to-electric-power improvement rate when the superconductor film thickness $\xi 2$ varies in the case of n=2.
Figure 18:
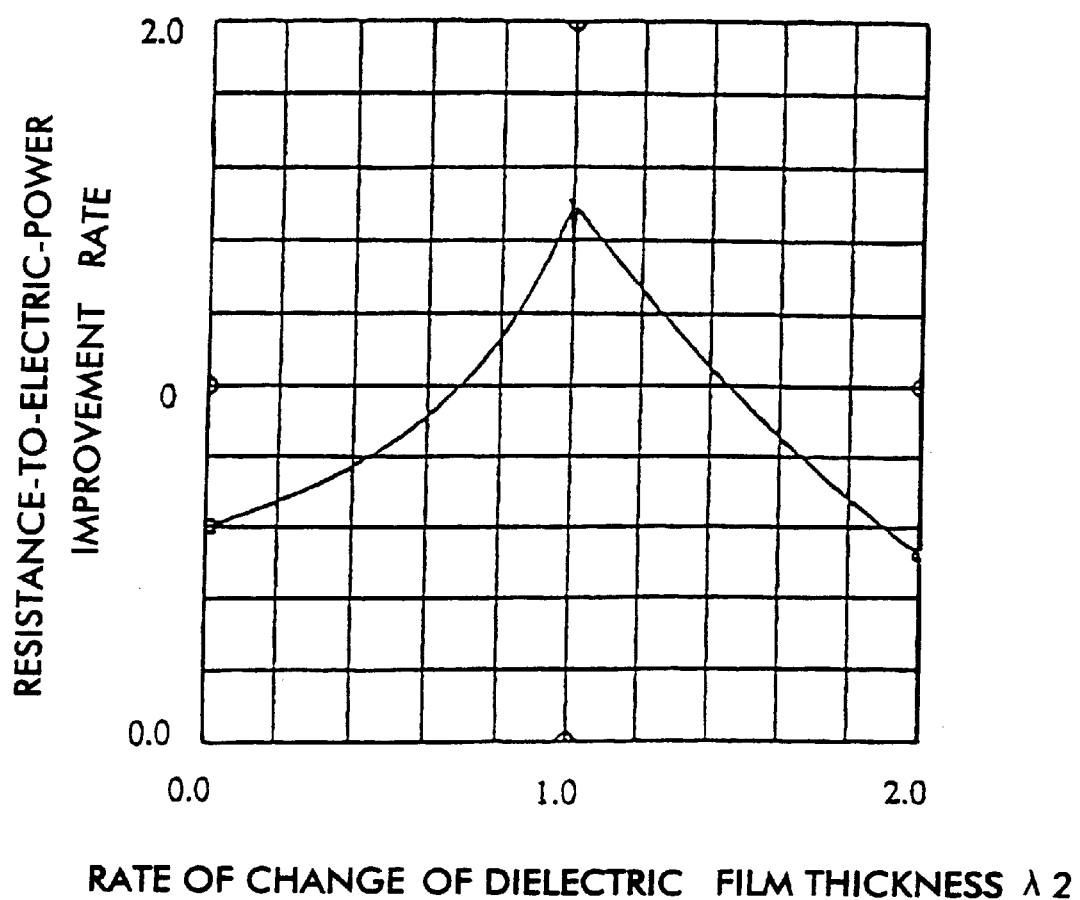
FIG. 18 is a graph of changes of the resistance-to-electric-power improvement rate when the dielectric film thickness $x_2$ varies in the case of n=3.
Figure 19:
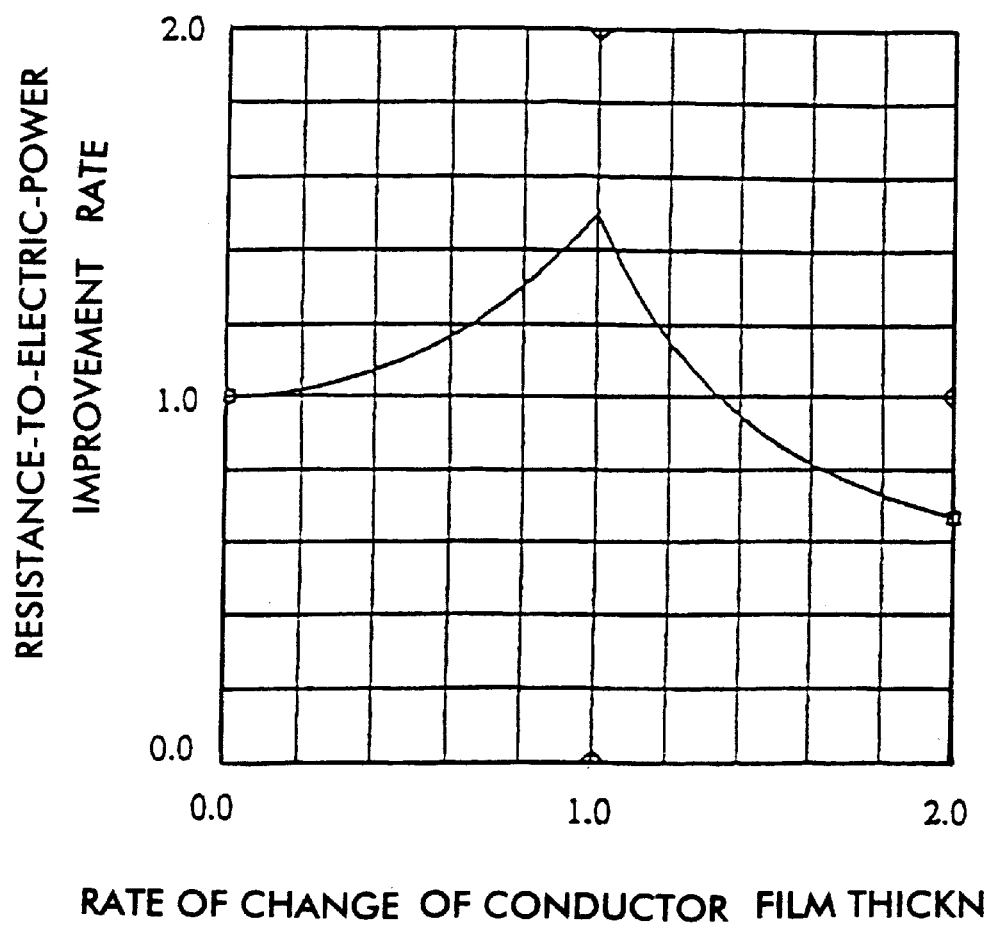
FIG. 19 is a graph of changes of the resistance-to-electric-power improvement rate when the superconductor film thickness $\xi 3$ varies in the case of n=3.
Figure 20:
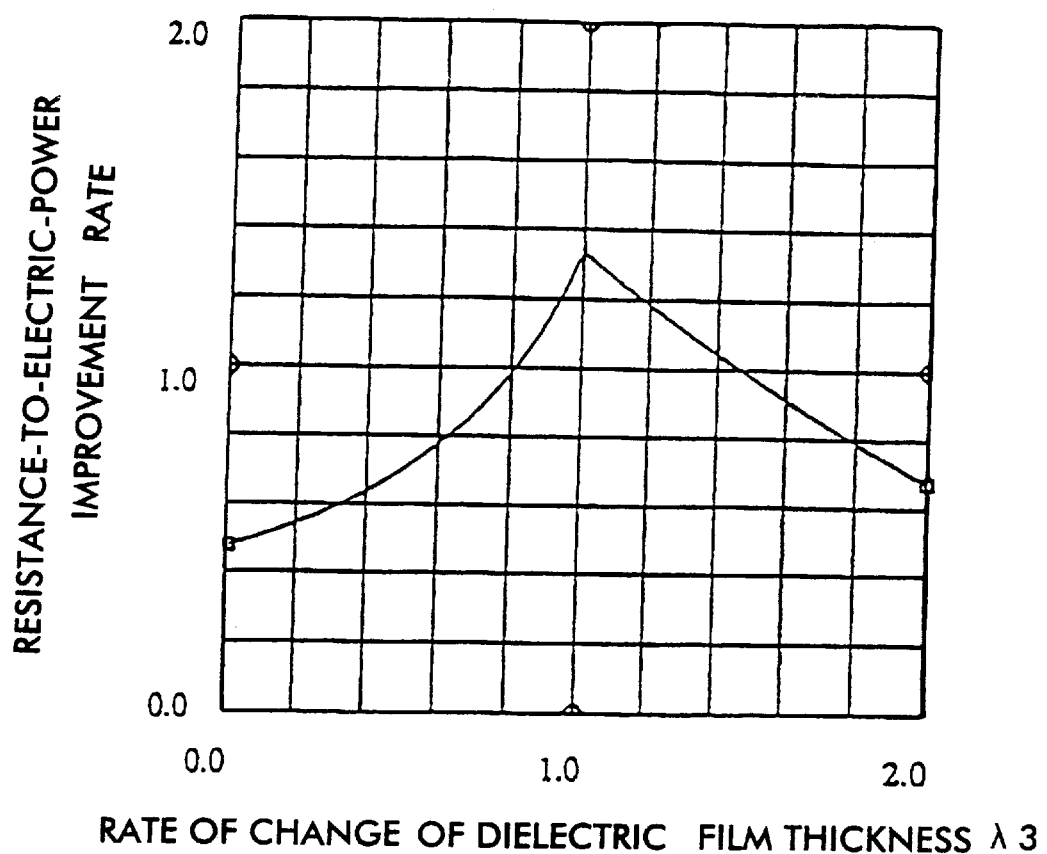
FIG. 20 is a graph of changes of the resistance-to-electric-power improvement rate when the dielectric film thickness $x_3$ varies in the case of n=4.
Figure 21:
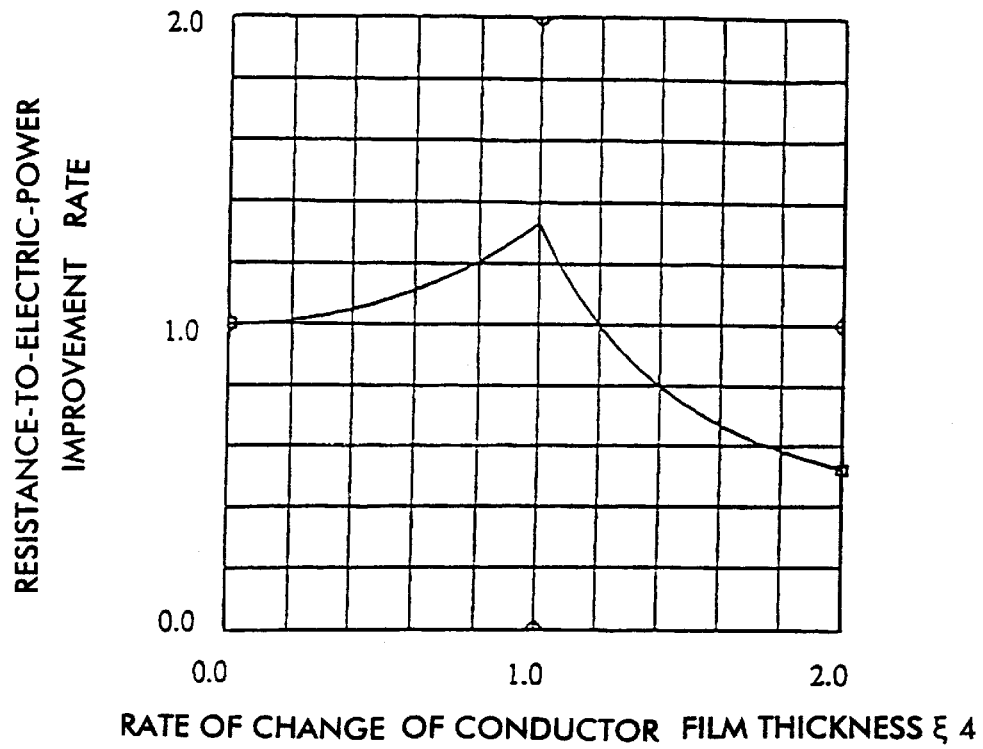
FIG. 21 is a graph of changes of the resistance-to-electric-power improvement rate when the superconductor film thickness $\xi 4$ varies in the case of n=4.
Figure 22:
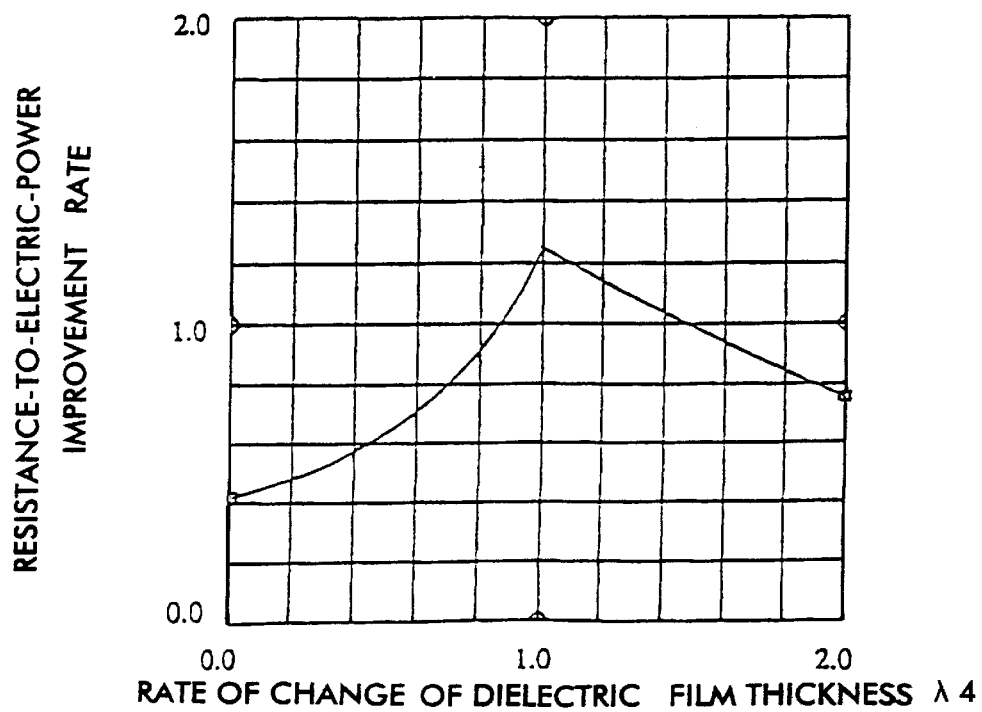
FIG. 22 is a graph of changes of the resistance-to-electric-power improvement rate when the dielectric film thickness $x_4$ varies in the case of n=5.
Figure 23:
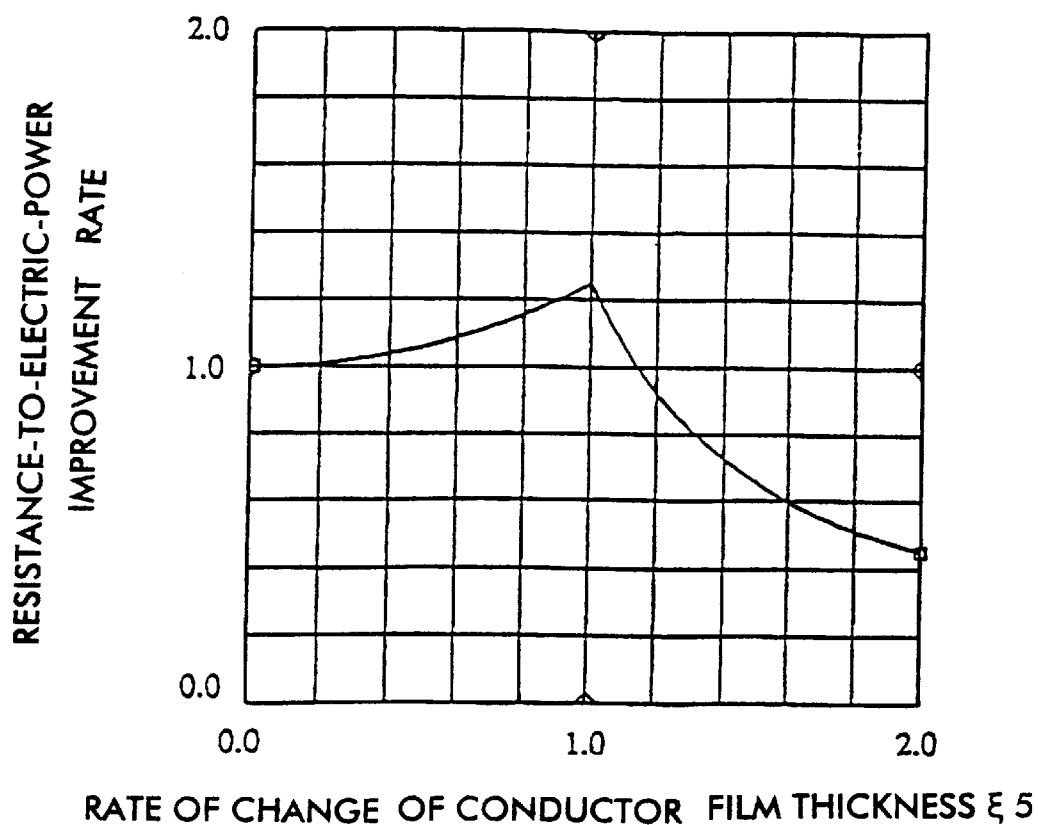
FIG. 23 is a graph of changes of the resistance-to-electric-power improvement rate when the superconductor film thickness $\xi 5$ varies in the case of n=5.

FIGS. 16 to 23 show changes in the improvement rate (see equation (110) in the case of the optimum value) of the resistance to electric power when the film thickness of the dielectric thin-film or the superconductor thin-film deviates from the optimum designed value, respectively, for the layers of n=2 to 5. Specifically, FIG. 16 is a graph of changes of the resistance-to-electric-power improvement rate when the dielectric film thickness $x_1$ varies in the case of n=2; FIG. 17 is a graph of changes of the resistance-to-electric-power improvement rate when the superconductor film thickness ξ2 varies in the case of n=2; FIG. 18 is a graph of changes of the resistance-to-electric-power improvement rate when the dielectric film thickness $x_2$ varies in the case of n=3; FIG. 19 is a graph of changes of the resistance-to-electric-power improvement rate when the superconductor film thickness ξ3 varies in the case of n=3; FIG. 20 is a graph of changes of the resistance-to-electric-power improvement rate when the dielectric film thickness $x_3$ varies in the case of n=4; FIG. 21 is a graph of changes of the resistance-to-electric-power improvement rate when the superconductor film thickness ξ4 varies in the case of n=4; FIG. 22 is a graph of changes of the resistance-to-electric-power improvement rate when the dielectric film thickness $x_4$ varies in the case of n=5; and FIG. 23 is a graph of changes of the resistance-to-electricpower improvement rate when the superconductor film thickness $\xi_5$ varies in the case of n=5. How to analyze these figures will be explained taking the case of n=4 (FIGS. 20 and 21) as an example. The improvement rate of the resistance to electric power shown in FIG. 20 indicates changes when only the film thickness $x_3$ of the dielectric of the bottommost layer deviates from the designed value on the condition that all the film thicknesses $\xi_1$, $\xi_2$, $\xi_3$, $x_1$, and $x_2$ up to the third layers, and the film thickness $x_4$ of the superconductor of the fourth layer are designed to be the same. The improvement rate of the resistance to electric power shown in FIG. 21 indicates changes when only the film thickness $\xi_4$ of the superconductor of the fourth layer deviates from the designed value on the condition that all the film thicknesses $\xi_1$, $\xi_2$, $\xi_3$, $x_1$, and $x_2$ up to the third layers, and $x_3$ of the next dielectric are designed to be the same. Here, in the two figures, the resistance to electric power is calculated on the assumption that approximation conditions $(\omega\tau)^2 \ll 1$ and $(\sigma_r/\sigma_i) \ll 1$ are satisfied, and every layer does not exceed the critical current density. The horizontal axis indicates the rate of change from the normalized optimum designed value of the film thickness. The point at which the rate of change is 1.0 indicates the optimum designed value. The vertical axis indicates the improvement rate of the resistance to electric power as a result of the addition of the fourth layer to the optimally designed third layer. That is, it is a value obtained by dividing (the improvement rate of the resistance to electric power of the whole four layers) by [the improvement rate (=3) of the resistance to electric power of the three layers]. Therefore, the maximum value thereof is 4/3. A case in which this value is 1.0 or less means that there is no effect as a result of the addition of the fourth layer.

As can be understood from FIGS. 20 and 21, even if the film thickness of the dielectric thin-film or the superconductor thin-film deviates slightly from the optimum designed value shown in Table 1, there is the effect of the improvement of the resistance to electric power. Therefore, the film thickness of each layer of the superconducting multilayer electrode may deviate slightly from the optimum designed value.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A superconducting multilayer electrode, comprising at least one TEM mode transmission line including a superconductor layer as a bottommost layer, and at least one superconductor layer and at least one dielectric layer alternately laminated on said bottommost layer, each superconductor layer being of a superconductor material and each superconductor layer and each dielectric layer having respective film thicknesses such that when a current flows through said electrode the maximum value of a current density flowing through each superconductor layer becomes the same, the thickness of each layer being determined based on a number of superconductor layers and dielectric layers, and the penetration depth of London $\lambda_L$ of the superconducting material.

2. A superconducting multilayer electrode according to claim 1, including a plurality of dielectric layers including said at least one dielectric layer and a plurality of superconducting layers including said at least one superconducting layer alternately laminated on said bottommost layer.

3. A superconducting multilayer electrode according to claim 2, wherein said superconductor layers from the bottommost layer to the topmost layer have film thicknesses such that the more upper the layer, the greater the thickness thereof becomes, and said dielectric layers from the bottommost layer to the topmost layer have respective film thicknesses such that the more upper the layer, the greater the thickness becomes.

4. A superconducting multilayer electrode according to claim 2, wherein, when the film thickness of the superconductor layer of a k-th layer ($k \geq 1$), normalized by the penetration depth of London, is denoted as $\xi_k$, the film thickness of the dielectric layer of the k-th layer, normalized by the penetration depth of London, is denoted as $x_k$, and the number of superconductor layers is set at n, said superconductor layers and said dielectric layers from the bottommost layer (k=n) to a topmost layer (k=1) have respective film thickness $\xi_k$ and $x_k$ (k=1 to n) respectively shown in the table below in the tenth or above layers:

TABLE 1

| k | $\xi_k$ | $W_k = X_k(\epsilon_m/\epsilon_s - 1)$ |
|---|---|---|
| 1 | $\infty$ | 1.0000 |
| 2 | 0.8814 | 0.7071 |
| 3 | 0.6585 | 0.5774 |
| 4 | 0.5493 | 0.5000 |
| 5 | 0.4812 | 0.4472 |
| 6 | 0.4335 | 0.4082 |
| 7 | 0.3977 | 0.3780 |
| 8 | 0.3695 | 0.3536 |
| 9 | 0.3466 | 0.3333 |
| 10 | 0.3275 | 0.3162 |

5. A superconducting multilayer electrode according to claim 4, wherein the at least one TEM mode transmission line includes a dielectric substrate laminated to the bottom most layer and a ground conductor layer laminated to said dielectric layer.

6. A superconducting multilayer electrode according to claim 1, wherein the thickness of k-th (k=1 stands for the topmost dielectric layer) superconductor layer Tck is defined by the formula:

$$0 < Tck <= 1.15 \cdot \xi_k \cdot \lambda_L$$

where $\xi_k = \sin h^{-1}(1/k-1)$, and the thickness of h-th (h=1 stands for the topmost dielectric layer) dielectric layer Tdh is defined by the formula:

$$0.85 \leq Tdh <= 1.4 \cdot X_h \cdot \lambda_L$$

where $X_h = 1/h(\epsilon_m/\epsilon_s - 1)^{-1}$, $\epsilon_m$ is the dielectric constant of the substrate and $\epsilon_s$ is the dielectric constant of the dielectric layer of the electrode.

7. A high-frequency transmission line comprising a superconducting multilayer electrode, wherein said superconducting multilayer electrode is laminated with at least one TEM mode transmission line which is comprised of a pair of superconductor layers of superconductor material with a dielectric layers sandwiched therebetween and said superconductor layer and said dielectric layer having respective film thicknesses such that when a current flows through said electrode the maximum value of a current density flowing through each superconductor layer becomes the same, the thickness of each layer being determined based on a number of superconductor layers and dielectric layers, and the penetration depth of London $\lambda_L$ of the superconductor material.

8. A high-frequency transmission line according to claim 7, wherein said high-frequency transmission line is a microstrip line.

9. A superconducting multilayer electrode according to claim 7, wherein the thickness of k-th (k=1 stands for the topmost superconductor layer) superconductor layer Tck is defined by the formula:

$$0 < Tck <= 1.15 \cdot \xi_k \cdot \lambda_L$$

where $\xi_k = \sin h^{-1}(1/k-1)$, and the thickness of h-th (k=1 stands for the topmost dielectric layer) dielectric layer Tdh is defined by the formula:

$$0.85 \leq Tdh <= 1.4 \cdot X_h \cdot \lambda_L$$

where $x_h = 1/h(\in_m/\in_s - 1)^{-1}$, $\in_m$ is the dielectric constant of the substrate and $\in_s$ is the dielectric constant of the dielectric layer of the electrode.

* * * * *